United States Patent
Chiu et al.

(10) Patent No.: US 10,090,357 B2
(45) Date of Patent: Oct. 2, 2018

(54) METHOD OF USING A SURFACTANT-CONTAINING SHRINKAGE MATERIAL TO PREVENT PHOTORESIST PATTERN COLLAPSE CAUSED BY CAPILLARY FORCES

(71) Applicant: TAIWAN SEMICONDUCTOR MANUFACTURING CO., LTD., Hsin-Chu (TW)

(72) Inventors: Wei-Chao Chiu, Hsinchu (TW); Chih-Chien Wang, Changhua (TW); Feng-Jia Shiu, Jhudong Township (TW); Ching-Sen Kuo, Taipei (TW); Chun-Wei Chang, Tainan (TW); Kai Tzeng, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 107 days.

(21) Appl. No.: 15/062,956

(22) Filed: Mar. 7, 2016

(65) Prior Publication Data
US 2017/0186808 A1 Jun. 29, 2017

Related U.S. Application Data

(60) Provisional application No. 62/272,127, filed on Dec. 29, 2015.

(51) Int. Cl.
*G03F 7/38* (2006.01)
*H01L 27/146* (2006.01)
(Continued)

(52) U.S. Cl.
CPC ........ *H01L 27/14683* (2013.01); *G03F 7/168* (2013.01); *G03F 7/32* (2013.01);
(Continued)

(58) Field of Classification Search
CPC ........................................................ G03F 7/11
See application file for complete search history.

(56) References Cited

U.S. PATENT DOCUMENTS 7,390,611 B2 6/2008 Lee
7,638,650 B2 * 12/2009 Qiu ....................... C07C 211/15
516/201

(Continued)

FOREIGN PATENT DOCUMENTS

KR 20030000475 1/2003
KR 20030056359 7/2003
(Continued)

*Primary Examiner* — Kathleen Duda
(74) *Attorney, Agent, or Firm* — Haynes and Boone, LLP

(57) ABSTRACT

A first photoresist pattern and a second photoresist pattern are formed over a substrate. The first photoresist pattern is separated from the second photoresist pattern by a gap. A chemical mixture is coated on the first and second photoresist patterns. The chemical mixture contains a chemical material and surfactant particles mixed into the chemical material. The chemical mixture fills the gap. A baking process is performed on the first and second photoresist patterns, the baking process causing the gap to shrink. At least some surfactant particles are disposed at sidewall boundaries of the gap. A developing process is performed on the first and second photoresist patterns. The developing process removes the chemical mixture in the gap and over the photoresist patterns. The surfactant particles disposed at sidewall boundaries of the gap reduce a capillary effect during the developing process.

20 Claims, 18 Drawing Sheets

(51) Int. Cl.
    *G03F 7/16*           (2006.01)
    *G03F 7/32*           (2006.01)
    *H01L 21/027*        (2006.01)
    *H01L 21/266*        (2006.01)
    *H01L 21/311*        (2006.01)
    *H01L 21/768*        (2006.01)

(52) U.S. Cl.
    CPC ............ *G03F 7/38* (2013.01); *H01L 21/0273* (2013.01); *H01L 21/266* (2013.01); *H01L 21/31144* (2013.01); *H01L 21/76802* (2013.01); *H01L 27/14636* (2013.01); *H01L 27/14643* (2013.01)

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 9,429,846 B2 * | 8/2016 | Hatakeyama | G03F 7/40 |
| 2003/0170571 A1 | 9/2003 | Nozaki et al. | |
| 2008/0138746 A1 * | 6/2008 | Kondoh | G03F 7/40 |
| | | | 430/326 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |

FOREIGN PATENT DOCUMENTS

| | | |
|---|---|---|
| KR | 20040008651 A | 1/2004 |
| KR | 10-2006-0102244 A | 9/2006 |
| TW | 201111329 A | 4/2011 |
| TW | 201520701 A | 6/2015 |

* cited by examiner

METHOD OF USING A SURFACTANT-CONTAINING SHRINKAGE MATERIAL TO PREVENT PHOTORESIST PATTERN COLLAPSE CAUSED BY CAPILLARY FORCES

PRIORITY DATA

The present application is a utility application of provisional patent application 62/272,127, filed on Dec. 29, 2015, entitled "METHOD OF USING A SURFACTANT-CONTAINING SHRINKAGE MATERIAL TO PREVENT PHOTORESIST PATTERN COLLAPSE CAUSED BY CAPILLARY FORCES", the contents of which are hereby incorporated by reference herein in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, photoresist masks may be more prone to the effects of capillary forces. This is exacerbated as the aspect ratio of the mask increases and/or as the pitch decreases. As a result, photoresist masks may collapse, for example due to being pulled by capillary forces between adjacent photoresist masks.

Therefore, while existing semiconductor fabrication technologies have been generally adequate for their intended purposes, they have not been entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As semiconductor fabrication technologies continue to evolve, the device sizes are becoming increasingly small. When the device sizes are sufficiently small, capillary forces may adversely interfere with fabrication. For example, the formation of photoresist masks may involve a developing process using a developer solution. At a sub-micron pitch level, the developer solution used in the developing process may cause the collapse of photoresist patterns due to capillary forces that effectively "pull" on the photoresist patterns. This problem is exacerbated when photoresist patterns are formed to have a tall and narrow (or high aspect ratio) trench disposed in between. The tall and narrow trench means that the photoresist mask is even more prone to the effects of capillary forces, which makes the collapse of the photoresist patterns more likely. Therefore, some conventional fabrication techniques have reduced the aspect ratio of the trench, for example by lowering the height of the photoresist patterns or increasing their separation. However, the resulting photoresist mask may not be capable of meeting the demands of advanced semiconductor fabrication processes, which may need the tall and narrow photoresist masks to pattern contact holes or define radiation-sensing pixels for image sensors.

To overcome the problems discussed above, the present disclosure involves a method of forming photoresist masks that are less prone to the capillary forces without compromising the aspect ratio, as discussed below with reference to FIGS. 1-18.

Figure 1:
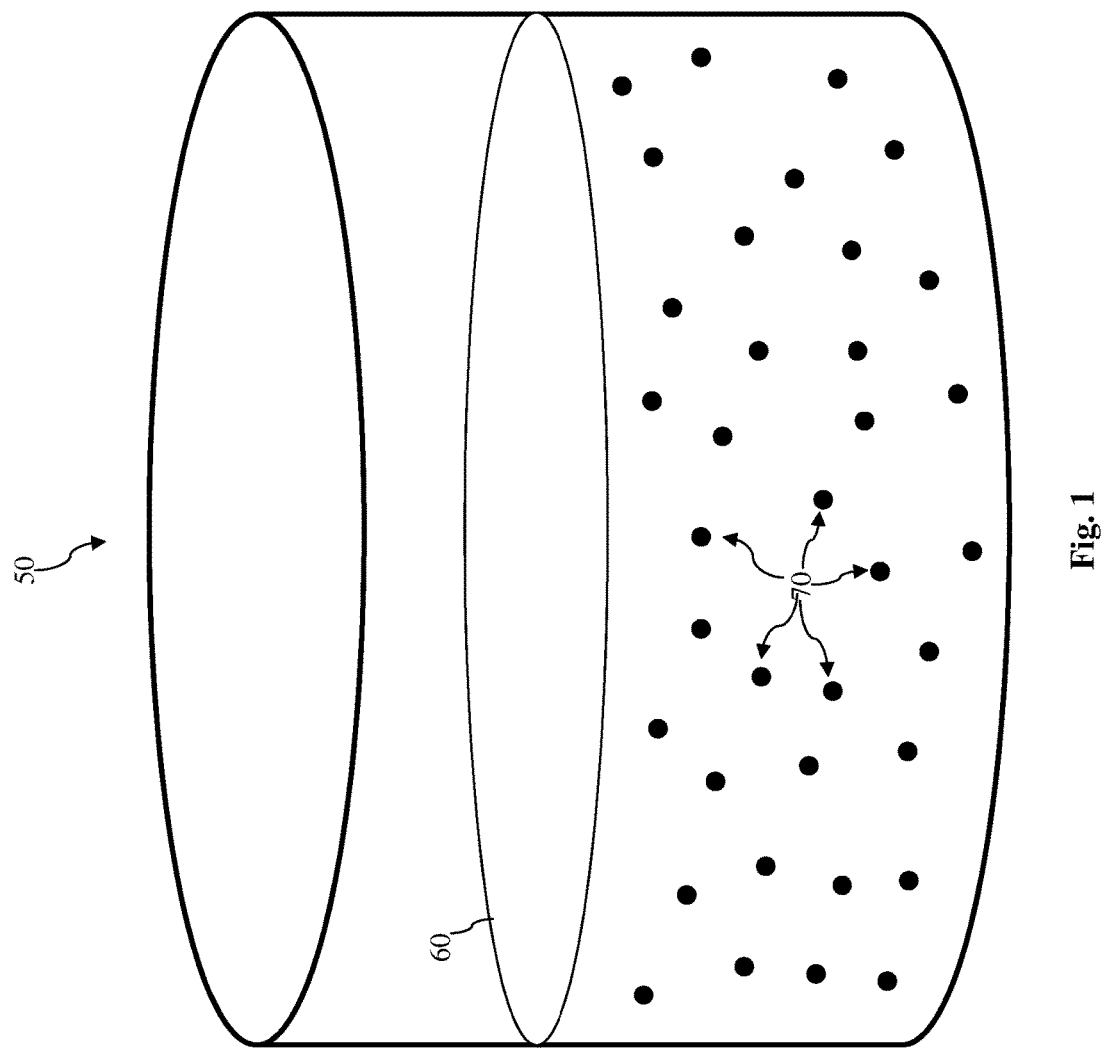
FIG. 1 illustrates surfactant particles being mixed in a chemical material according to embodiments of the present disclosure.

FIG. 1 illustrates a mixing process in which surfactant particles or surfactant compounds are mixed into a chemical. In more detail, a container 50 contains a chemical material 60. In some embodiments, the chemical material 60 includes a "resolution enhancement lithography assisted by chemical shrinkage" material (or RELACS). The RELACS material includes a water-soluble material (e.g., a polymer) having thermal cross-linking properties. As such, a portion of the RELACS material coated on a photoresist film can become cross-linked to the photoresist film during a baking process, thereby reducing gaps between adjacent photoresist films. The rest of the unreacted (e.g., un-cross-linked) RELACS material can be removed in a developing process following the baking. As examples, the details of the RELACS material are discussed in an article entitled "Resists Join the Sub-Lambda Revolution," by Laura J. Peters, published in Semiconductor International, in September, 1999, as well as in Japanese Patent Application KOKAI publication No. H10-73927, the contents of each of which are hereby incorporated by reference in their respective entireties.

In some other embodiments, the chemical material 60 includes a "shrink assist film for enhanced resolution" material (or SAFIER) developed by Tokyo Ohka Kogyo Co. The SAFIER material includes an aqueous solution that contains thermo-responsive polymers that facilitate photoresist flow during a baking process. The SAFIER material may or may not react with the photoresist chemically but provides mechanical support to the sidewalls of the photoresist as it flows. The mechanical support provided by the SAFIER material minimizes photoresist pattern profile degradation. The SAFIER material can be removed in a developing process following the baking. As an example, the details of the SAFIER material are discussed in a paper entitled "Electron-beam SAFIER™ process and its application for magnetic thin-film heads," by XiaoMin Yang, et al., published in the Journal of Vacuum Science & Technology B, Volume 22, Issue 6, in December 2004, the contents of which are hereby incorporated by reference in its entirety.

According to the various aspects of the present disclosure, surfactant particles 70 are mixed in the chemical material 60. The surfactant particles 70 include compounds or molecules that lower the surface tension (or interfacial tension) between liquids or between a liquid and a solid. For example, a surfactant particle may include a molecule having one end that is water-soluble and an opposite end that is oil-soluble. The surfactant molecules may aggregate to form micelles. In some embodiments, the surfactant particles 70 each include a fluorinated compound. In some other embodiments, the surfactant particles 70 each include a hydrocarbon compound.

As is shown in FIG. 1, the surfactant particles 70 are mixed in the chemical material 60 such that they are homogeneously distributed throughout the chemical material 60. In other words, the surfactant particles 70 are mixed uniformly or evenly within the chemical material 60. In some other embodiments, the surfactant particles 70 are still distributed throughout the chemical material 60, but the distribution may not be entirely uniform. In any case, the chemical mixture obtained by mixing the surfactant particles in the chemical material 60 will be applied to photoresist patterns in a later process. For ease of reference, this chemical mixture may be interchangeably referred to as a shrinkage material hereinafter.

Figure 2:
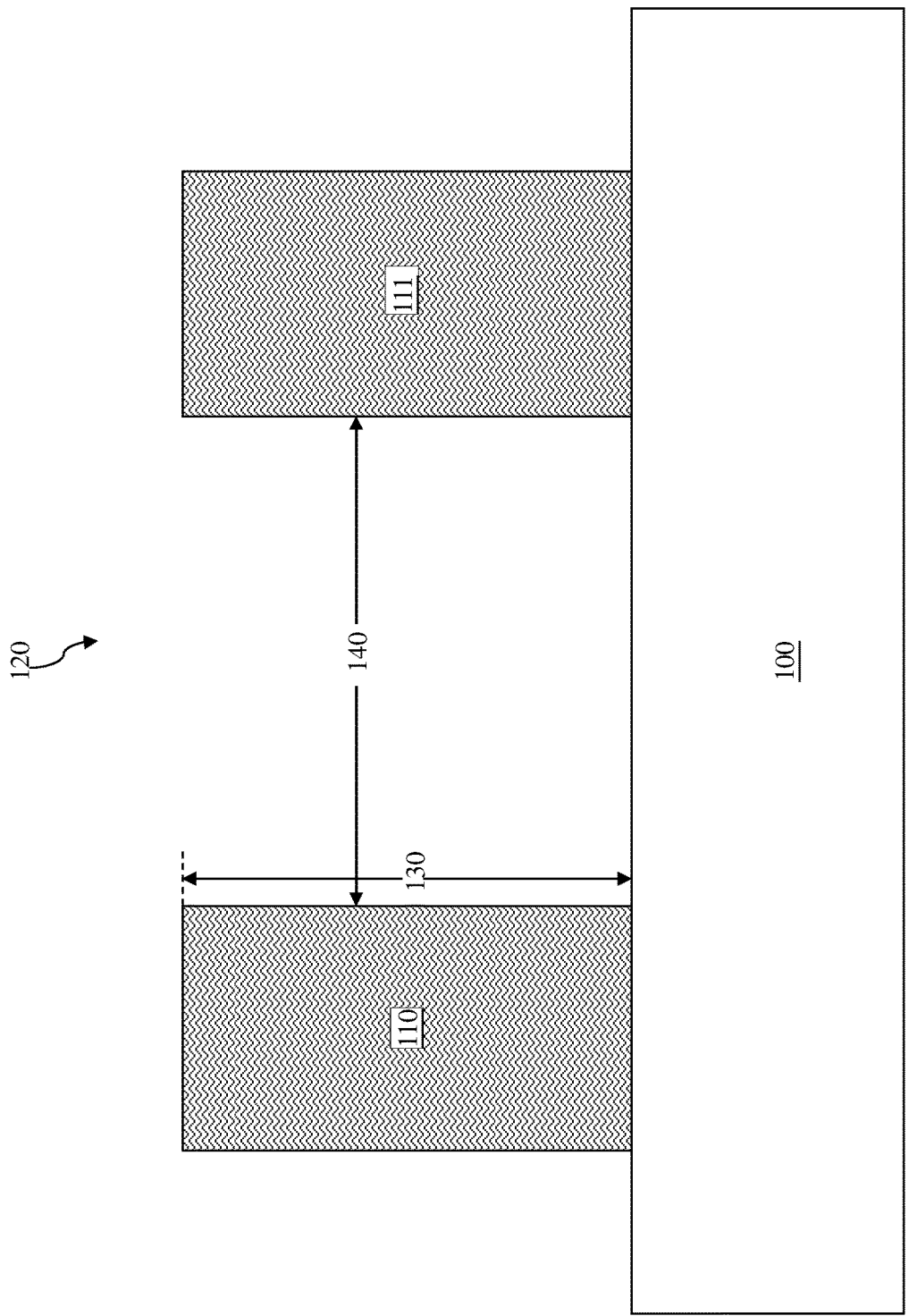
FIGS. 2-15 are diagrammatic fragmentary cross-sectional side views of a semiconductor device at various stages of fabrication in accordance with embodiments of the present disclosure.

FIGS. 2-15 are diagrammatic fragmentary cross-sectional side views of a semiconductor device undergoing various stages of fabrication according to embodiments of the present disclosure. Referring to FIG. 2, a substrate 100 is provided. The substrate 100 may include a silicon substrate that is doped with an n-type dopant such as phosphorous or arsenic, or it may be doped with a p-type dopant such as boron. The substrate 100 could also include other elementary semiconductors such as germanium and diamond. The substrate could optionally include a compound semiconductor and/or an alloy semiconductor. Furthermore, the substrate 100 could include an epitaxial layer (epi layer), may be strained for performance enhancement, and may include a silicon-on-insulator (SOI) structure. It is also understood that one or more layers may also be formed over the substrate 100, but these layers are not specifically illustrated in FIG. 2 for reasons of simplicity. For the purposes of the present disclosure, the reference to the substrate 100 hereinafter may be considered to include just the substrate 100 itself, or it may be considered to include the one or more layers formed over the substrate 100.

Photoresist patterns 110 and 111 are formed over the substrate 100. The photoresist patterns 110 and 111 may be formed by depositing (e.g., spin-coating) a photoresist film over the substrate 100 and thereafter patterning the photoresist film in a lithography process, which may involve one or more processes such as exposure, post-exposure bake, developing, etc. (not necessarily in that order). The photoresist patterns 110-111 shown in FIG. 2 are at an after-developing-inspection (ADI) stage. At this stage, the photoresist patterns 110-111 are separated by a gap 120, or it may be said that the photoresist patterns 110-111 define a trench 120. The gap/trench 120 has a height 130 (vertical dimension) and a width 140 (lateral dimension). An aspect ratio of the trench 120 may be defined as a ratio of the height 130 and the width 140.

As semiconductor device fabrication technologies progress, it is desired to have a greater aspect ratio. One way to increase the aspect ratio is to reduce the width 140 by application of the shrinkage material. For example, referring to FIG. 3, the shrinkage material 60 is applied over the substrate 100 and coated on the photoresist patterns 110-111. In the embodiment shown in FIG. 3, the shrinkage material 60 includes the RELACS material discussed above. The coating of the shrinkage material 60 may be done using a spin-coating process. As discussed above, the surfactant particles 70 have been mixed throughout the shrinkage material 60, for example in a homogeneously distributed manner. As such, the surfactant particles 70 are mixed throughout the coated shrinkage 60 (i.e., coated on and around the photoresist patterns 110-111) as well. Thus, there are surfactant particles 60 disposed on (or near) the sidewall surfaces of the photoresist patterns 110-111.

Figure 4:
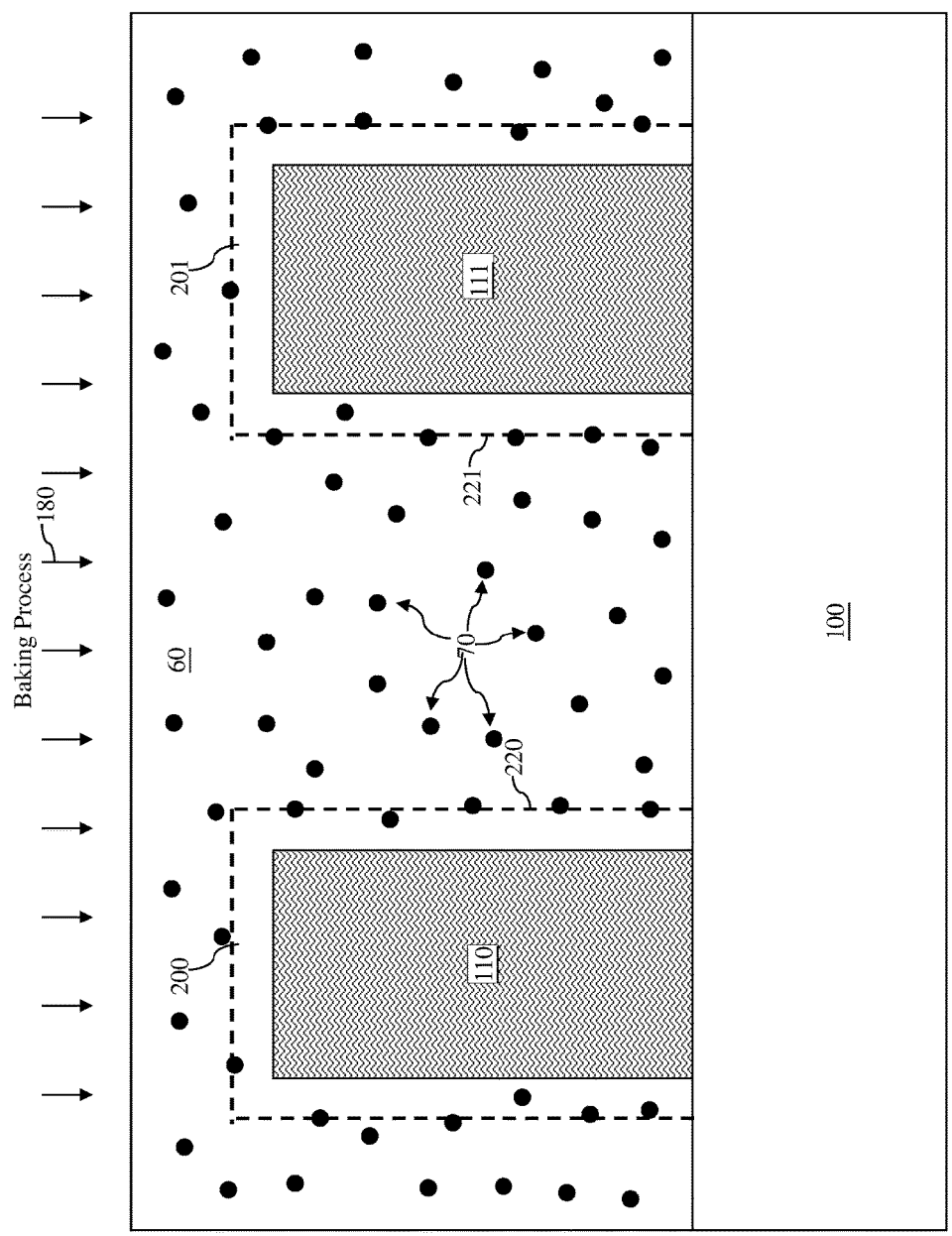

Referring now to FIG. 4, a baking process (or heating process) 180 is performed to the shrinkage material 60 and the photoresist patterns 110-111. In some embodiments, the baking process is performed at a process temperature in a range between about 140 degrees Celsius and 170 degrees Celsius and for a process duration in a range between about 60 seconds to about 120 seconds. The baking process 180 forms cross-linking films 200 and 201 around the photoresist patterns 110-111. In response to the thermal energy in the baking process 180, portion of the shrinkage material 60 (RELACS material herein) coated around the photoresist patterns 110-111 undergo a chemical reaction, thereby causing these portions of the shrinkage material 60 to become cross-linked. As a result, cross-linking films 200-201 are formed on the upper and sidewall surfaces of the photoresist patterns 110-111. Due to the cross-linking nature, the cross-linking films 200-201 adhere to the upper and sidewall surfaces of the photoresist patterns 110-111, which prevents the cross-linking films 200-201 from being removed in a subsequent developing process. In other words, the cross-linking films 200-201 may be viewed as a part of the enlarged photoresist patterns 110-111 when the photoresist patterns 110-111 are used as masks in subsequent processes.

According to the various aspects of the present disclosure, at least some of the surfactant particles 70 are distributed on (or near) the sidewall surfaces of the cross-linking films 200-201, for example on or near the sidewall surfaces 220-221. As discussed above, the surfactant particles 70 are configured to reduce surface tension on the sidewall surfaces (e.g., the surface tension on the sidewall surfaces 220-221). As such, the surfactant particles 70 disposed on the sidewall surfaces of the cross-linking films 200-201 can reduce the capillary forces experienced by the photoresist patterns 110-111 in a developing process performed later, as discussed below in more detail.

Figure 5:
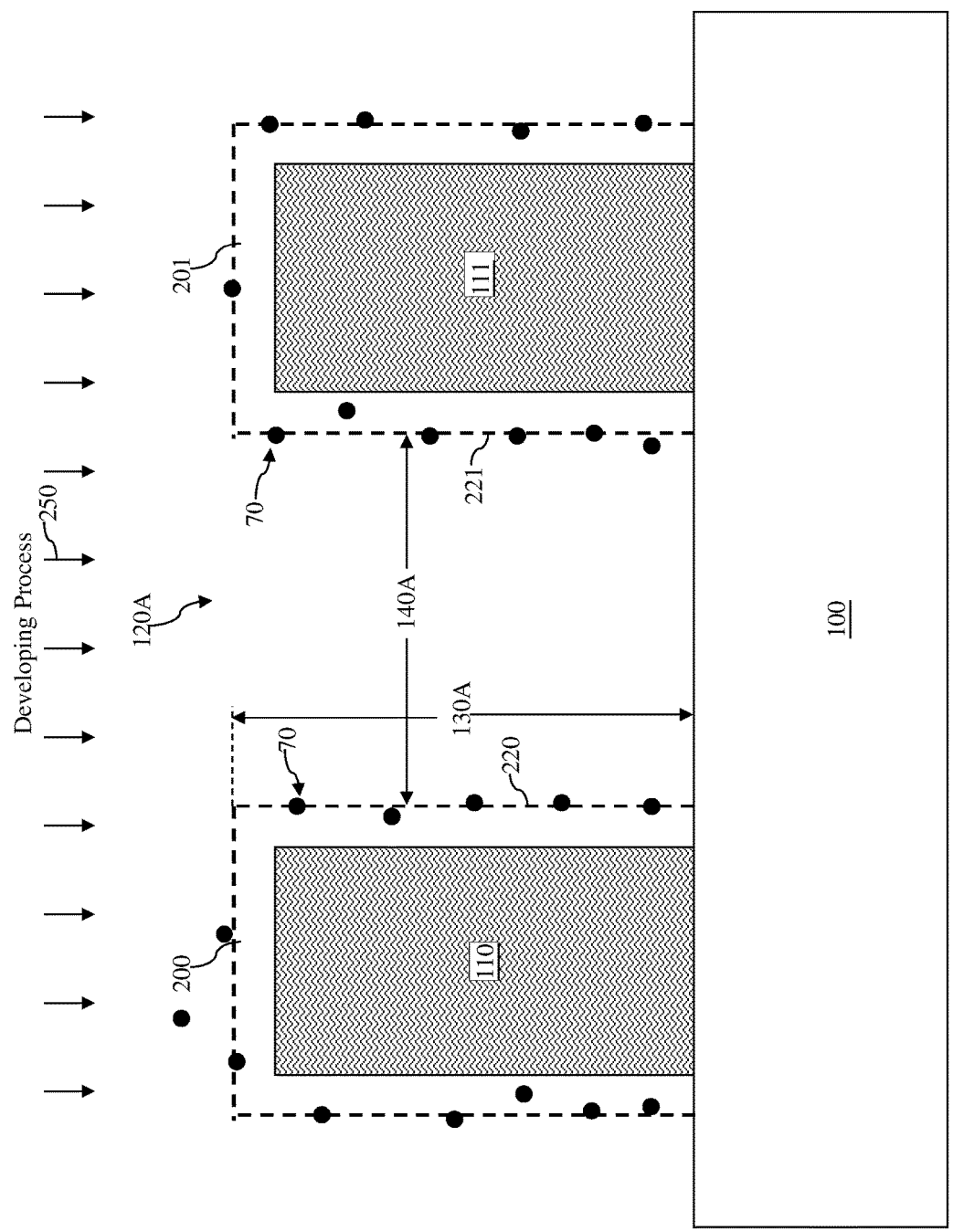

Referring now to FIG. 5, a developing process 250 is performed to remove the portions of the shrinkage material 60 that are not cross-linked yet. The developing process 250 includes applying a developer solution to rinse the shrinkage material 60 and the photoresist patterns 110-111. In some embodiments, the developer solution contains pure water or di-ionized water (DIW). In other embodiments, the developer solution contains tetramethyl ammonium hydroxide (TMAH). The removal of the shrinkage material 60 forms a trench (or gap) 120A between the photoresist patterns 110-111. Compared to the previous trench 120 shown in FIG. 2, the reduced trench 120A has an increased height (vertical dimension) 130A and a reduced width (lateral dimension) 140A. The reduced width 140A allows smaller device sizes to be achieved. For example, the photoresist patterns 110-111 may be used (as a mask) to pattern a smaller contact hole as a part of an interconnect structure, or they may be used (as an ion implantation mask) to form a smaller pixel for an image sensor device.

As discussed above, the surfactant particles 70 that are disposed on or near the sidewall surfaces 220-221 reduce the surface tension of the sidewall surfaces. Capillary force is correlated with (or is a function of) the surface tension. For example, Fc (capillary force) is correlated with $\gamma * \cos 2\theta$ (surface tension). Since the surface tension on the sidewalls 220-221 is reduced by the presence of the surfactant particles 70 disposed thereon, the capillary forces are reduced inside the trench 120A as well.

The reduction of the capillary forces inside the trench is beneficial, because it reduces the likelihood of the photoresist patterns 110-111 collapsing. In more detail, as the device sizes become small, the trench 120A is becoming narrower and narrower. Consequently, the effects of capillary forces inside the trench 120A become more and more pronounced. The capillary forces effectively "pull" the photoresist patterns 110-111 toward each other. If the capillary forces are stronger than the adhesion of the photoresist patterns 110-111 to the substrate 100, then one (or both) of the photoresist patterns 110-111 may topple over and collapse. The likelihood of the photoresist patterns 110-111 collapsing is further increased as the trench 120A becomes taller and narrower. In other words, since the trench 120A has a smaller width 140A and greater height 130A than the trench 120, its aspect ratio is increased, which makes the photoresist patterns 110-111 otherwise more likely to collapse.

However, the presence of the surfactant particles 70 on the sidewall surfaces 220-221 reduce the surface tension on the sidewalls, thereby reducing the capillary forces experienced by the photoresist patterns 110-111 during the developing process 250. As such, even though the trench 120A has an increased aspect ratio, the reduction of the capillary forces in turn reduces the likelihood of the photoresist pattern collapse. This means that the photoresist patterns 110-111 can be formed to be taller and closer together (i.e., having a higher aspect ratio trench in between) than traditionally feasible. For example, whereas the aspect ratio of the trench between photoresist patterns can have an aspect ratio as high as about 8:1 or 9:1 without risking photoresist pattern collapse, the trench 120A can be formed to have an aspect ratio as high as 11:1, or as high as 12:1 (or even greater) without risking photoresist pattern collapse. The high aspect ratio (i.e., the taller and more closely located) photoresist patterns 110-111 are advantageous in performing subsequent fabrication processes such as contact hole etching or pixel formation by ion implantation, which will be discussed in greater detail further below.

Figure 3:
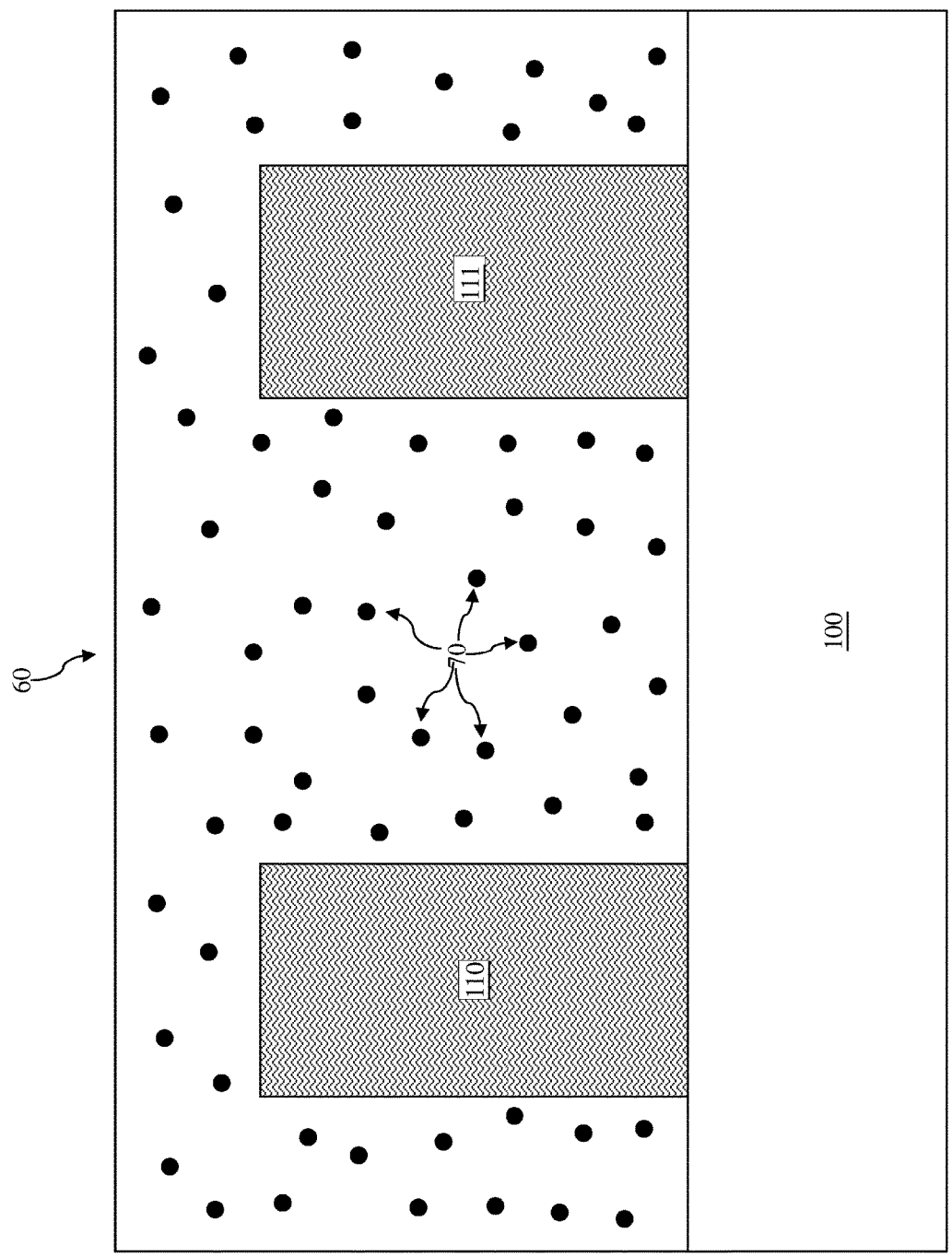
Figure 6:
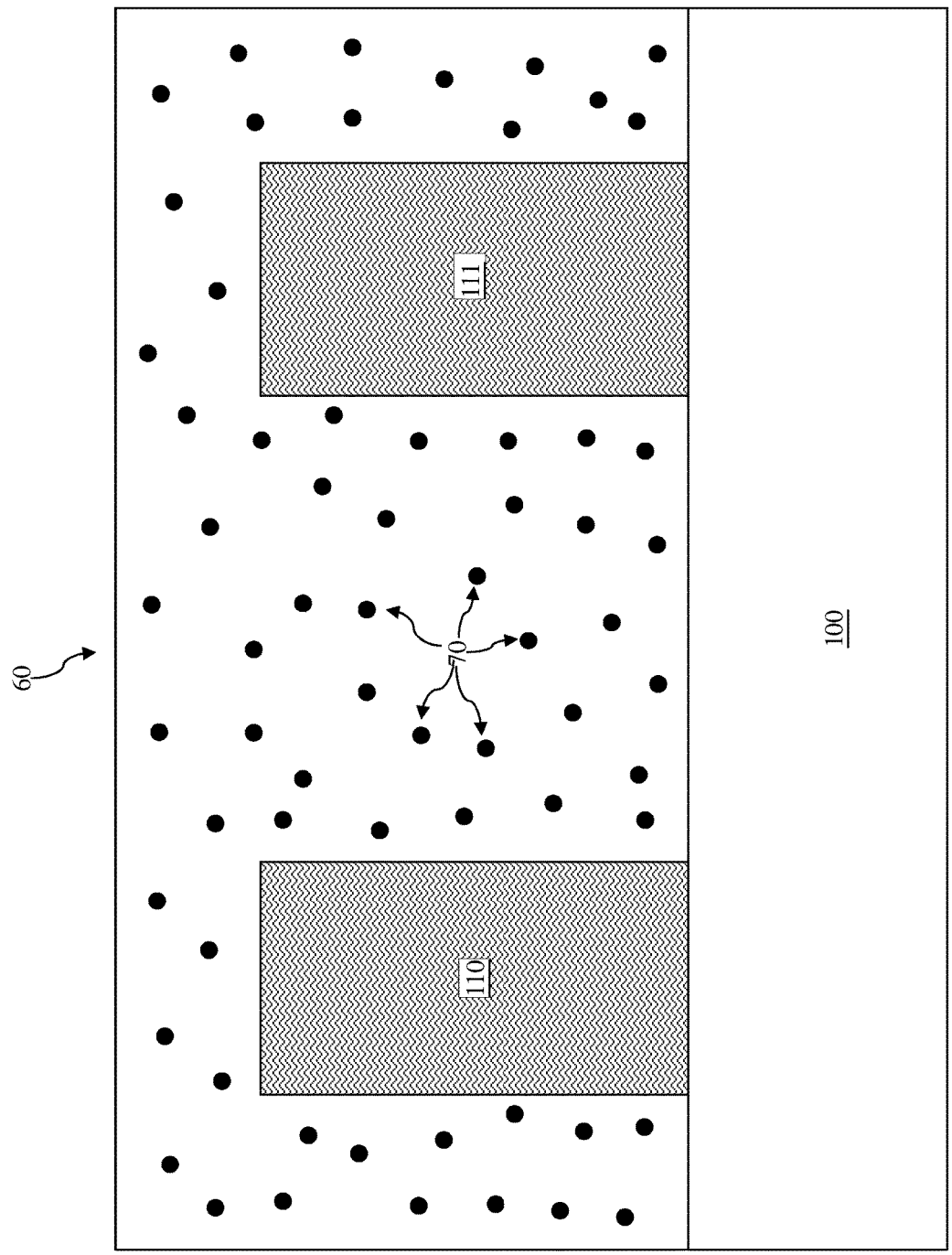
Figure 7:
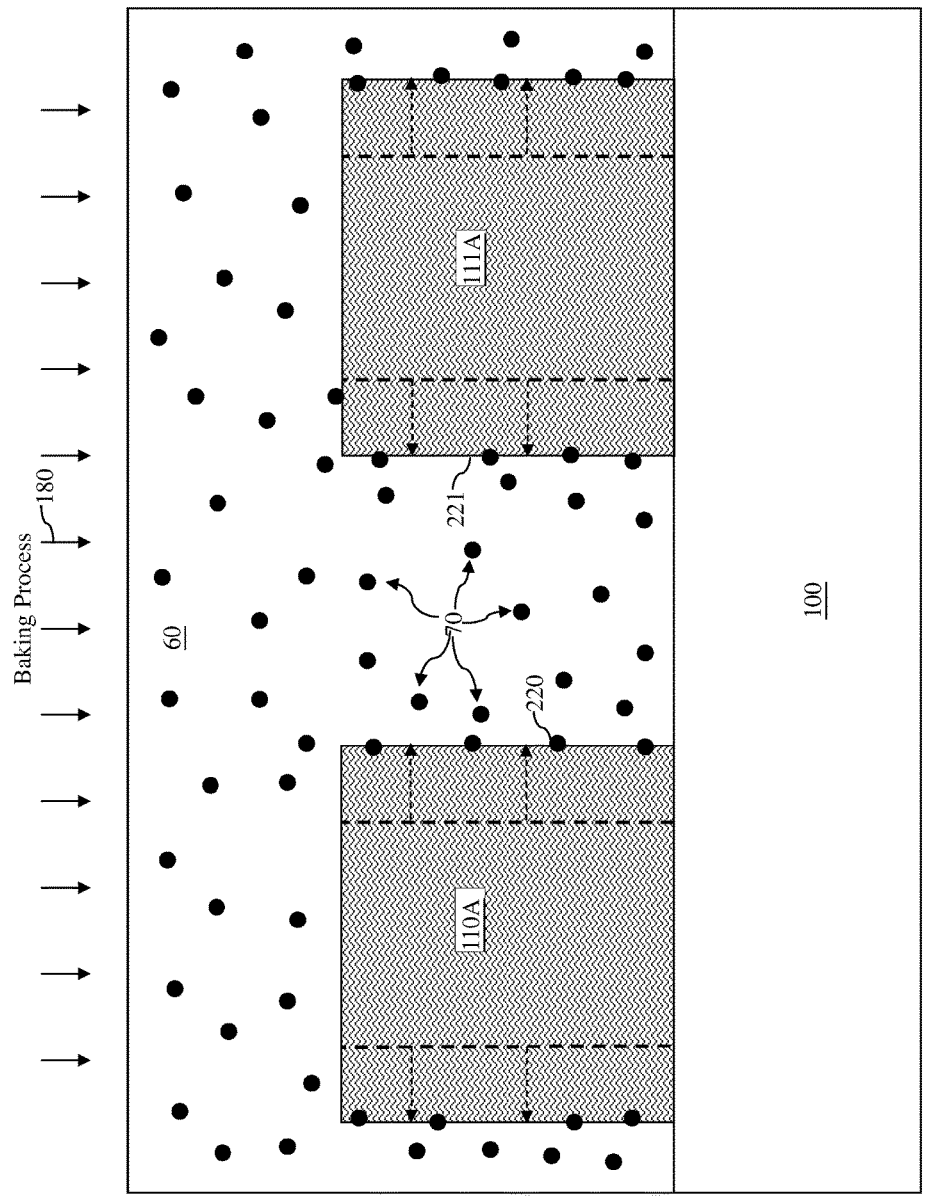
Figure 8:
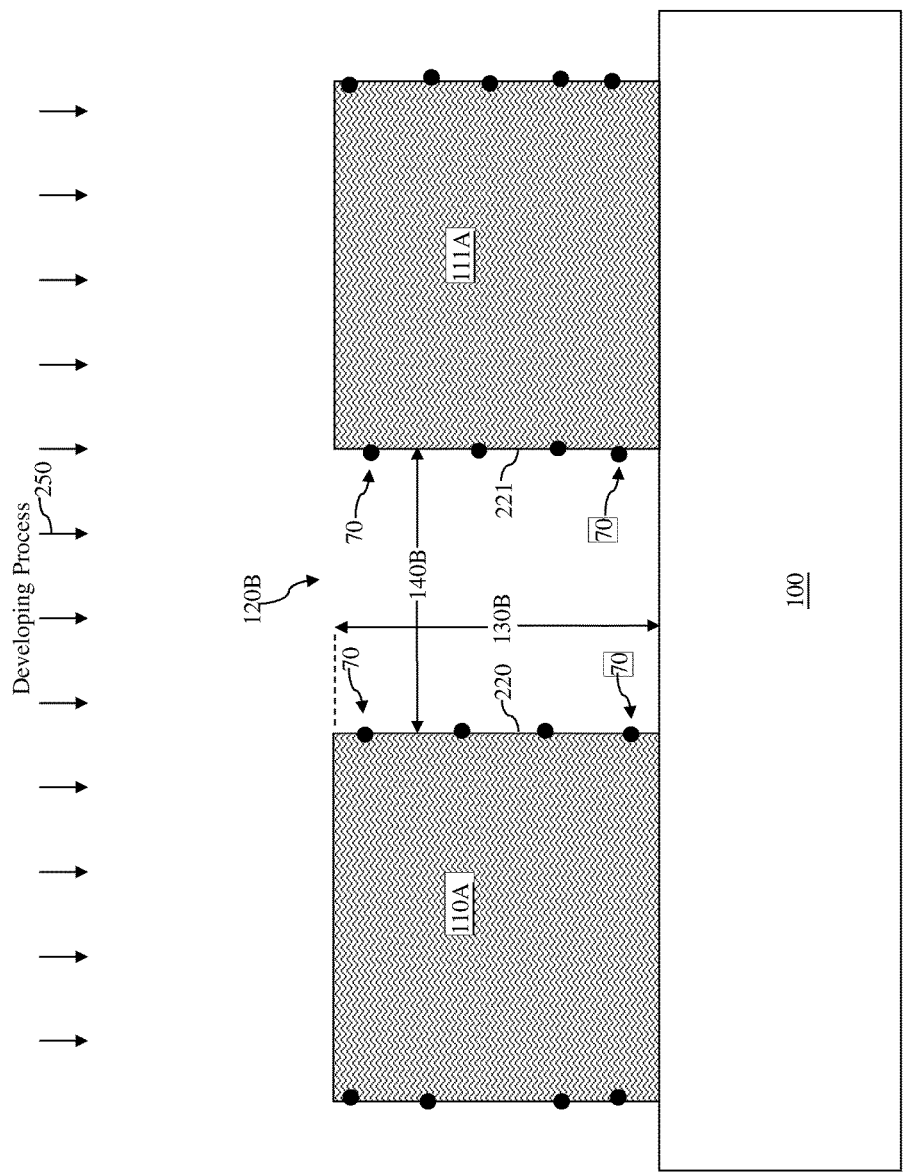

FIGS. 3-5 illustrate an embodiment of the present disclosure where the RELACS material is used as the shrinkage material 60. FIGS. 6-8 illustrate another embodiment of the present disclosure where the SAFIER material (discussed above with reference to FIG. 1) is used as the shrinkage material. For reasons of clarity and consistency, similar components appearing in FIGS. 3-8 will be labeled the same.

Referring to FIG. 6, the shrinkage material 60 that contains the SAFIER material is applied over the substrate 100 and coated on the photoresist patterns 110-111. Again, since the surfactant particles 70 have been mixed throughout (e.g., homogeneously distributed or uniformly distributed) the shrinkage material 60, the surfactant particles 70 are disposed on (or near) the sidewall surfaces of the photoresist patterns 110-111 as well.

Referring now to FIG. 7, a baking process (or heating process) 180 is performed to the shrinkage material 60 and the photoresist patterns 110-111. In some embodiments, the baking process is performed at a process temperature in a range between about 100 degrees Celsius and 160 degrees Celsius and for a process duration in a range between about 60 seconds to about 90 seconds. The SAFIER material contains thermo-responsive polymers that facilitate a photoresist flow during the baking process 180. In other words, the photoresist patterns 110 and 111 flow outward laterally and are reshaped as photoresist patterns 110A and 111A, respectively. The sidewalls of the photoresist patterns before the flow occurs are illustrated herein as the broken lines, and the directions of the flow are illustrated using the arrows that point laterally in FIG. 7. The sidewalls 220-221 of the photoresist patterns consequently move closer toward each other, thereby reducing the distance in between the photoresist patterns. The height of the photoresist patterns 110A-111A is also reduced due to the lateral expansion. The shrinkage material 60 (i.e., the SAFIER material) also provides some mechanical support to the sidewalls 220-221 of the photoresist patterns 110A-111A during the photoresist flow, thereby allowing the sidewalls 220-221 to maintain their shapes.

After the photoresist flow forms the photoresist patterns 110A-111A, at least some of the surfactant particles 70 are still distributed on (or near) the sidewall surfaces 220-221 of the photoresist patterns 110A-111A, since the surfactant particles are mixed homogeneously within the shrinkage material 60. As discussed above, the surfactant particles 70 are configured to reduce surface tension on the sidewall surfaces 220-221, which reduces the capillary forces experienced by the photoresist patterns 110A-111A in a developing process discussed below.

Referring now to FIG. 8, a developing process 250 is performed to remove the shrinkage material. The developing process 250 includes applying a developer solution to rinse the shrinkage material 60 and the photoresist patterns 110-111. In some embodiments, the developer solution contains di-ionized water (DIW). The removal of the shrinkage material 60 forms a trench (or gap) 120B between the photoresist patterns 110A-111A. Compared to the previous trench 120 shown in FIG. 2, the reduced trench 120B has a reduced height (vertical dimension) 130B and a reduced width (lateral dimension) 140B. The reduced width 140B allows smaller device sizes to be formed. For example, the photoresist patterns 110A-111A may be used (as a mask) to pattern a smaller contact hole as a part of an interconnect structure, or they may be used (as an ion implantation mask) to form a smaller pixel for an image sensor device. The reduced height 130B can be compensated by forming taller photoresist patterns 110-111 in the first place.

As discussed above, the surfactant particles 70 that are disposed on or near the sidewall surfaces 220-221 reduce the surface tension of the sidewall surfaces. Also as discussed above, capillary force is correlated with the surface tension. Since the surface tension on the sidewalls 220-221 is reduced by the presence of the surfactant particles 70 disposed thereon, the capillary forces are reduced inside the trench 120B as well. And for the reasons discussed above, the reduction of the capillary forces inside the trench 120B reduces the likelihood of the photoresist patterns 110-111 collapsing. This means that the photoresist patterns 110A-111A can be formed to be taller and closer together (i.e., having a higher aspect ratio trench such as greater than 11:1) than traditionally feasible, which is advantageous in subsequent fabrication processes such as contact hole etching or pixel formation by ion implantation, which are discussed in greater detail below.

Figure 9:
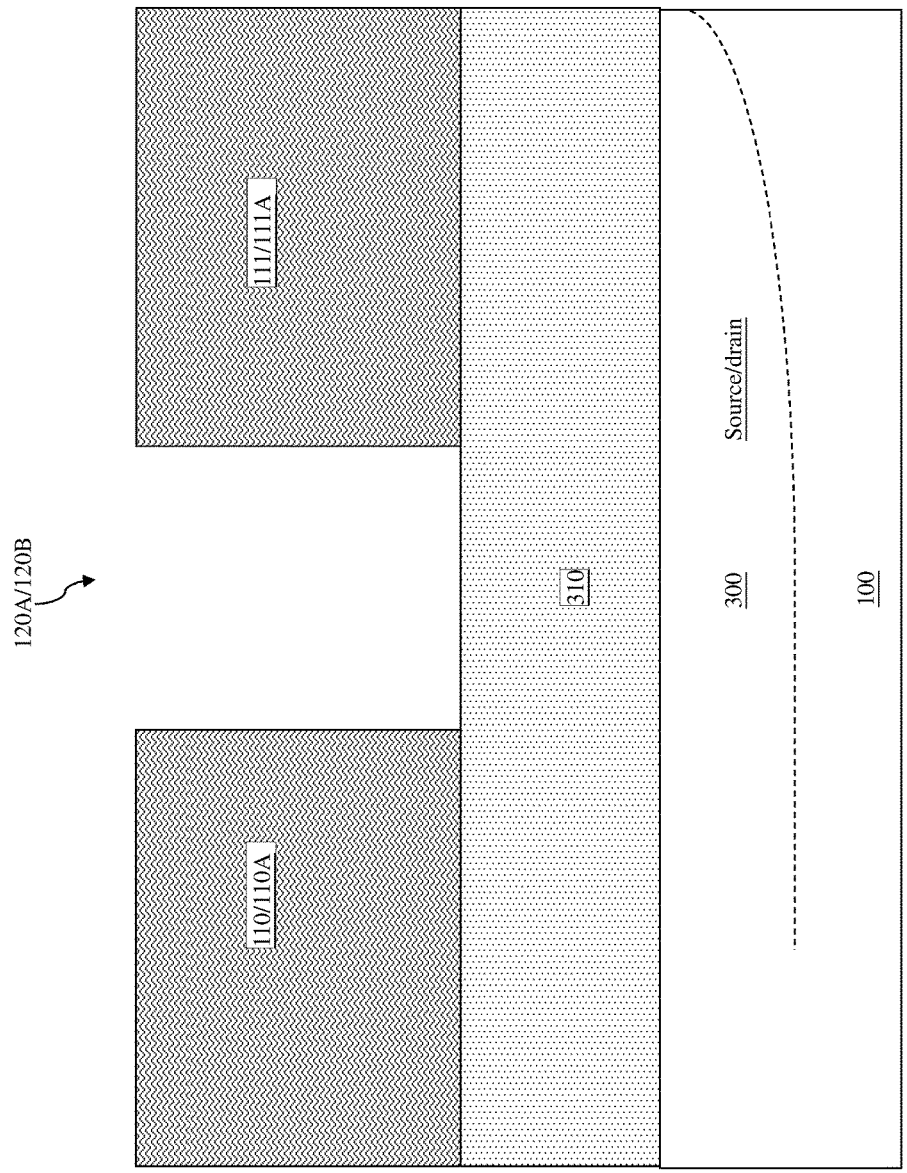
Figure 10:
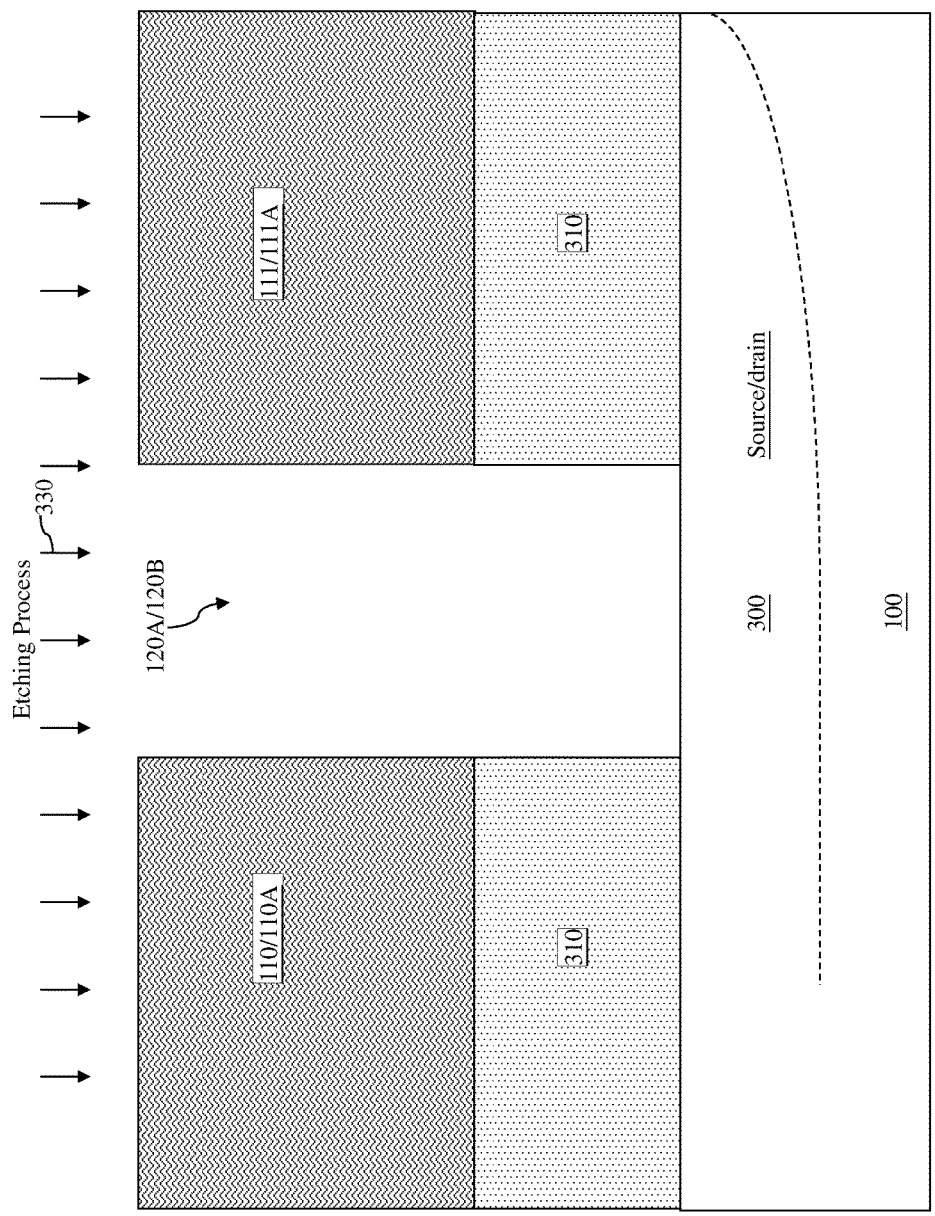
Figure 11:
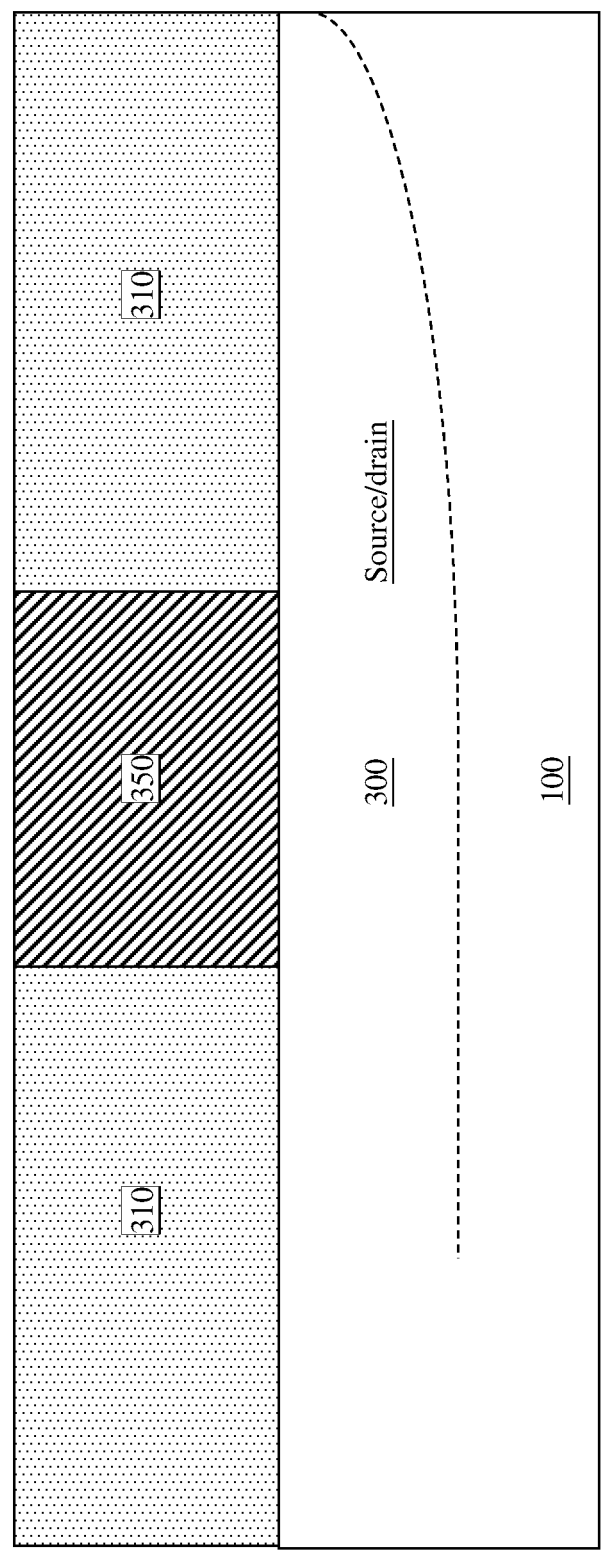

FIGS. 9-11 illustrate a process of forming conductive contacts using the photoresist patterns 110-111 of FIG. 5 or the photoresist patterns 110A-111A of FIG. 8 as a mask. Referring to FIG. 9, a source/drain region 300 is formed in the substrate 100. The source/drain region 300 is a source or drain of a transistor device, such as a MOSFET device. The source/drain region 300 may be formed by one or more ion implantation or diffusion processes. A dielectric layer 310 is formed over the source/drain region 300. The dielectric layer 310 may contain a low-k dielectric material.

The photoresist patterns 110-111 of FIG. 5 (or the photoresist patterns 110A-111 of FIG. 8) are formed over the dielectric layer 310 by the processes discussed above in association with FIG. 2-5 or 6-8. In other words, the photoresist patterns 110-111 (or 110A-111A) are formed by patterning a photoresist film into different photoresist patterns separated by a gap/trench 120A (or 120B), and then reducing that gap/trench with the application of a shrinkage material 60 with the surfactant particles 70 mixed therein. The reduced trench 120A/120B can achieve a higher aspect ratio (i.e., narrower and/or taller) due to the surfactant particles on its sidewalls that reduce capillary forces as the shrinkage material 60 is removed during a developing process. For reasons of simplicity, the surfactant particles 70 (or the cross-linked film 200-201) are not specifically illustrated in FIG. 9. The photoresist patterns 110-111 (or 110A-111A) may now be used as a mask to pattern a contact hole for the source/drain region 300.

Referring now to FIG. 10, an etching process 330 is performed to the dielectric layer 310 to extend the trench 120A/120B into the dielectric layer 310. In other words, the dielectric layer 310 is "opened", so as to expose a portion of the source/drain region 300. This "opening" is also referred to as a contact hole, since a conductive contact is to be formed in there subsequently. The etching process 330 is performed using the photoresist patterns 110-111 (or the photoresist patterns 110A-111A) as an etching mask. The greater aspect ratio of the trench 120A (or 120B) achieved by the processes of the present disclosure allows this contact hole to be formed smaller (e.g., narrower). Again, this can be done without risking the collapse of the photoresist patterns 110-111 (or 110A-111A).

Referring now to FIG. 11, the photoresist patterns 110-111 (or 110A-111A) are removed, for example through a photoresist ashing or stripping process. A conductive contact 350 is formed in the contact hole, which may be performed by depositing a conductive material such as tungsten (or copper or aluminum) in the contact hole. The conductive contact 350 provides electrical connectivity to the source/drain region 300 of the transistor.

In addition to forming contacts (i.e., forming contact holes) for transistors, the processes of the present disclosure may also be used in the fabrication of an image sensor device. The image sensor device is a semiconductor image sensor configured to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals. The image sensor device further includes additional circuitry and input/outputs that are provided adjacent to the grid of pixels for providing an operation environment for the pixels and for supporting external communication with the pixels.

The image sensor device may be a front side illustrated (FSI) image sensor or a back side illuminated (BSI) image sensor. In the embodiment illustrated in FIG. 12, a back side illuminated image sensor device is used, but it is understood that the aspects of the present disclosure may apply to the front side illuminated image sensor as well.

Figure 12:
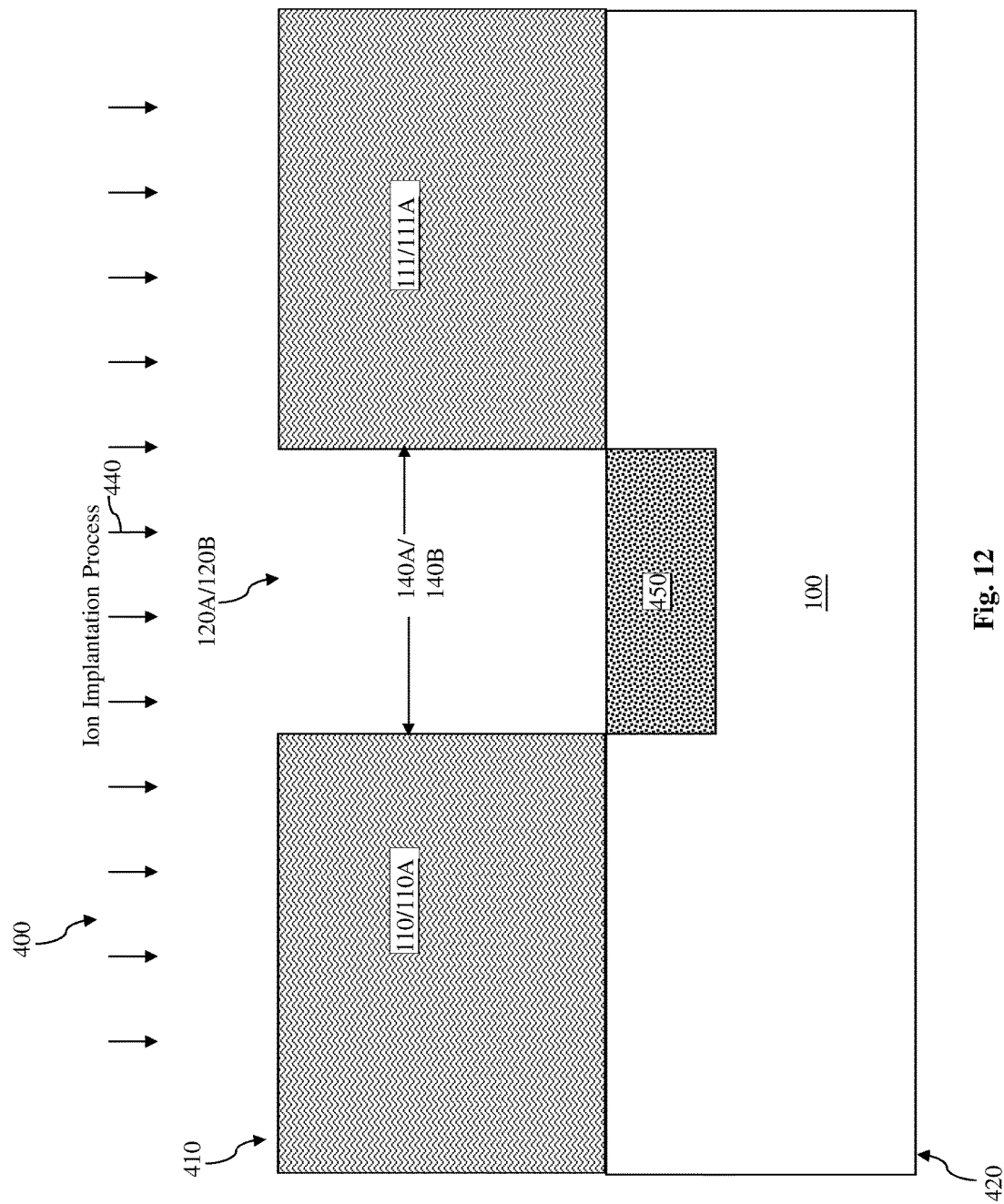

Referring to FIG. 12, the back side illuminated image sensor device 400 includes a substrate 100, which may also be referred to as a device substrate. The device substrate 100 has a front side (also referred to as a front surface) 410 and a back side (also referred to as a back surface) 420. For a BSI image sensor device such as the image sensor device 400, radiation is projected from the back side 420 (after a substrate thinning down process discussed below) and enters the remaining substrate through the back surface 420. In some embodiments, an initial thickness of the substrate is in a range from about 100 microns to about 3000 microns, for example between about 500 microns and about 1000 microns.

The photoresist patterns 110-111 of FIG. 5 (or the photoresist patterns 110A-111 of FIG. 8) are formed over the substrate 100 by the processes discussed above in association with FIG. 2-5 or 6-8. In other words, the photoresist patterns 110-111 (or 110A-111A) are formed by patterning a photoresist film into different photoresist patterns separated by a gap/trench 120A (or 120B), and then reducing that gap/trench with the application of a shrinkage material 60 with the surfactant particles 70 mixed therein. The reduced trench 120A/120B can achieve a higher aspect ratio (i.e., narrower and/or taller) due to the surfactant particles on its sidewalls that reduce capillary forces as the shrinkage material 60 is removed during a developing process. For reasons of simplicity, the surfactant particles 70 (or the cross-linked film 200-201) are not specifically illustrated in FIG. 12.

The photoresist patterns 110-111 (or 110A-111A) may be used as a mask in an ion implantation process 440 performed to implant dopant ions into the front side 410 of the substrate 100. The photoresist mask prevents ions from being implanted into regions of the substrate 100 disposed therebelow. The ions are implanted through the trench 120A (or 120B) into the substrate. The implanted ions have an opposite type of conductivity than the substrate 100 and form a radiation-sensing element 450 of the image sensor device 400, for example as a part of the pixel to detect light that is projected toward the substrate from the back side 420. In some embodiments, the radiation-sensing element 450 is a part of a photodiode. Although a single radiation-sensing element 450 is shown in FIG. 12, it is understood that a plurality of radiation-sensing elements are formed in a similar manner, which may be referred to as a pixel array.

As discussed above, the trench 120A (or 120B) is formed to have a greater aspect ratio than the trenches in conventional processes. Again, this greater aspect ratio can be achieved without risking the collapse of the photoresist patterns 110-111 (or 110A-111A). The smaller width 140A (or 140B) of the trench 120A (or 120B) allows the width (lateral dimension) of the radiation-sensing element 450 to be smaller compared to conventional radiation-sensing elements too, since the width of the radiation-sensing element 450 is directly correlated with the width of the trench 120A (or 120B). The smaller width of the radiation-sensing element 450 allows a greater number of pixels to be packed onto the same size package for the image sensor device 400, or allows the image sensor device 400 to be smaller than conventional image sensor devices, both of which are considered improvements. In addition, the taller photoresist patterns 110-111 (or 110A-111A) allow the photoresist mask to be more effective at blocking dopant ions from being implanted into the wrong regions of the substrate 100. In other words, the photoresist mask is more effective due to its increased height.

Although the embodiment in FIG. 12 uses the photoresist patterns 110-111 (or 110A-111A) as an ion implantation mask directly, it is understood that in alternative embodiments, the photoresist mask may be used to pattern a layer therebelow to form a hard mask first, and the hard mask is then used as the ion implantation mask in the ion implantation process 440.

Figure 13:
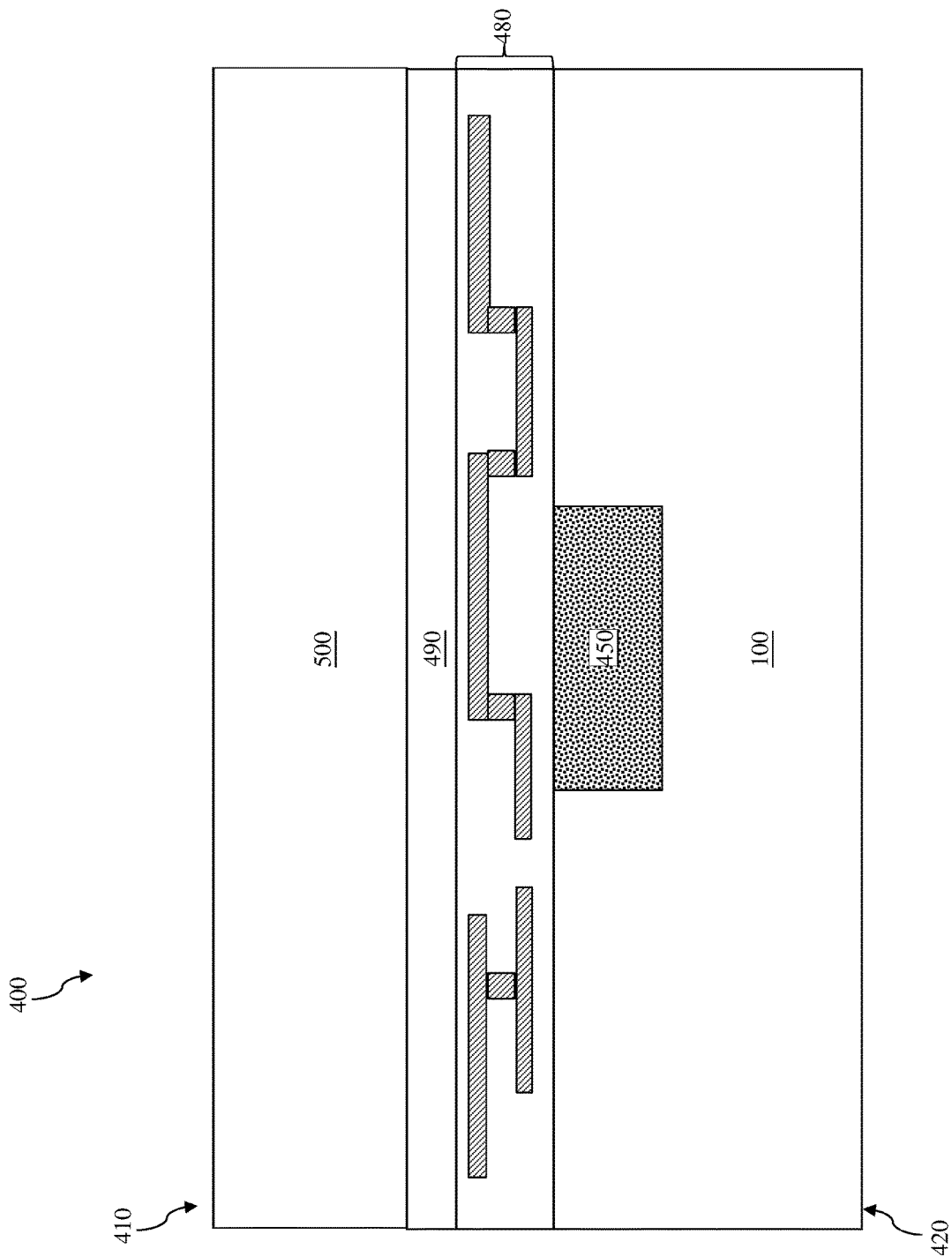

Additional processes are performed to complete the fabrication of the image sensor device 400. Referring to FIG. 13, the photoresist mask is removed. An interconnect structure 480 is formed over the front side 410 of the device substrate 100. The interconnect structure 480 includes a plurality of patterned dielectric layers and conductive layers that provide interconnections (e.g., wiring) between the various doped features, circuitry, and input/output of the image sensor device 400. The interconnect structure 480 includes an interlayer dielectric (ILD) and a multilayer interconnect (MLI) structure. The MLI structure includes contacts, vias and metal lines. The MLI structure may include conductive materials such as aluminum, aluminum/silicon/copper alloy, titanium, titanium nitride, tungsten, polysilicon, metal silicide, or combinations thereof, being referred to as aluminum interconnects. The interconnect elements may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (e.g., vias/contacts) and horizontal connection (e.g., conductive lines).

Still referring to FIG. 13, a buffer layer 490 is formed on the interconnect structure 480. In the present embodiment, the buffer layer 490 includes a dielectric material such as silicon oxide. Alternatively, the buffer layer 490 may optionally include silicon nitride. The buffer layer 490 is formed by CVD, PVD, or other suitable techniques. The buffer layer 490 is planarized to form a smooth surface by a CMP process.

Thereafter, a carrier substrate 500 is bonded with the device substrate 100 through the buffer layer 490, so that processing of the back side 420 of the device substrate 100 can be performed. The carrier substrate 500 in the present embodiment is similar to the substrate 100 and includes a silicon material. Alternatively, the carrier substrate 500 may include a glass substrate or another suitable material. The carrier substrate 500 may be bonded to the device substrate 100 by molecular forces—a technique known as direct bonding or optical fusion bonding—or by other bonding techniques known in the art, such as metal diffusion or anodic bonding.

The buffer layer 490 provides electrical isolation between the device substrate 100 and the carrier substrate 500. The carrier substrate 500 provides protection for the various features formed on the front side 410 of the device substrate 100, such as the radiation-sensing element 450. The carrier substrate 500 also provides mechanical strength and support for processing of the back side 420 of the device substrate 100 as discussed below. After bonding, the device substrate 100 and the carrier substrate 500 may optionally be annealed to enhance bonding strength.

Figure 14:
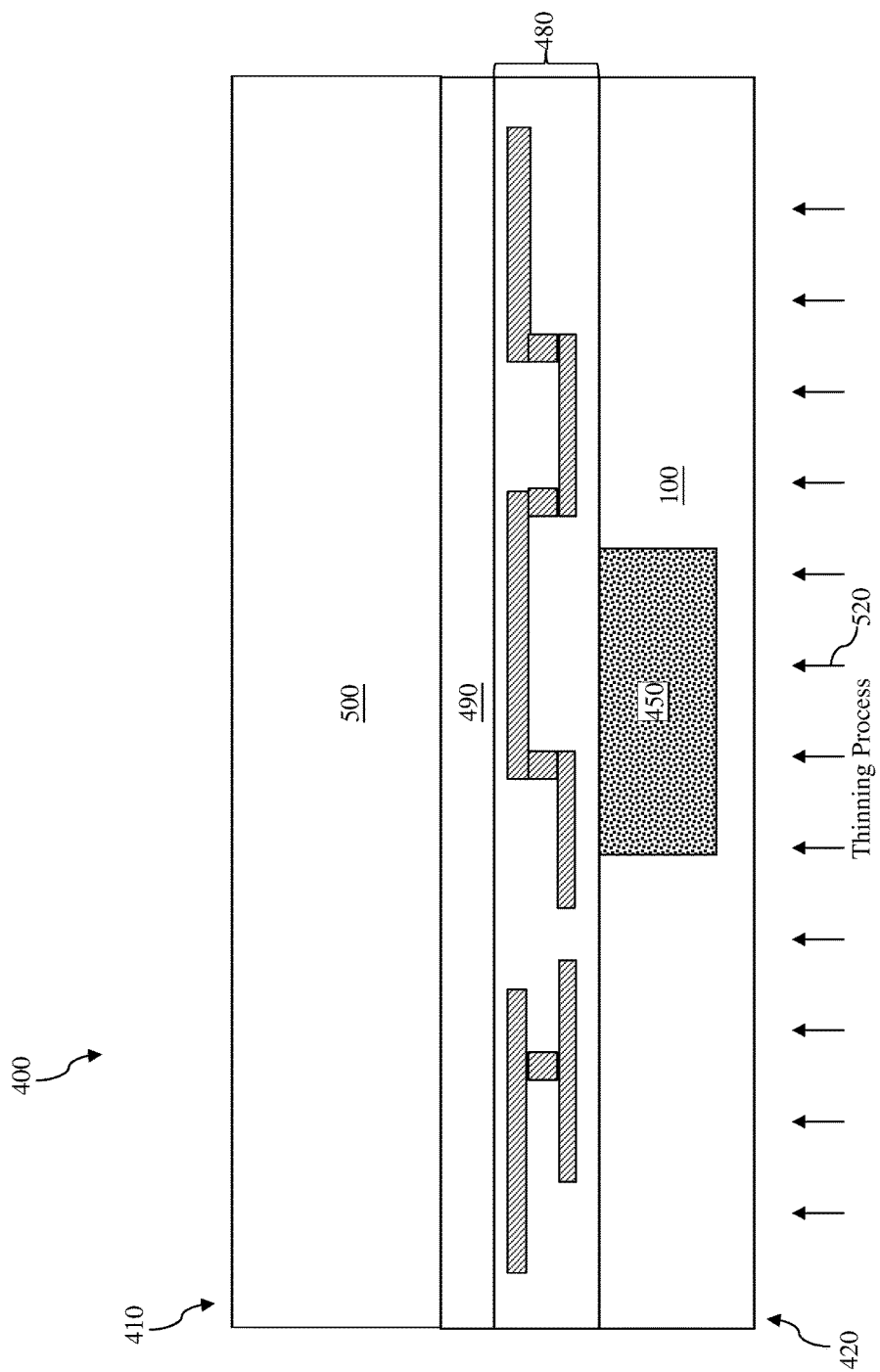

Referring to FIG. 14, after the carrier substrate 500 is bonded, a thinning process 520 is then performed to thin the device substrate 100 from the backside 420. The thinning process 520 may include a mechanical grinding process and a chemical thinning process. A substantial amount of substrate material may be first removed from the device substrate 100 during the mechanical grinding process. Afterwards, the chemical thinning process may apply an etching chemical to the back side 420 of the device substrate 100 to further thin the device substrate 100 to a thickness on the order of a few microns. In some embodiments, the thickness of the thinned substrate 100 is greater than about 1 micron but less than about 5 microns. It is also understood that the particular thicknesses disclosed in the present disclosure are mere examples and that other thicknesses may be implemented depending on the type of application and design requirements of the image sensor device 400.

Figure 15:
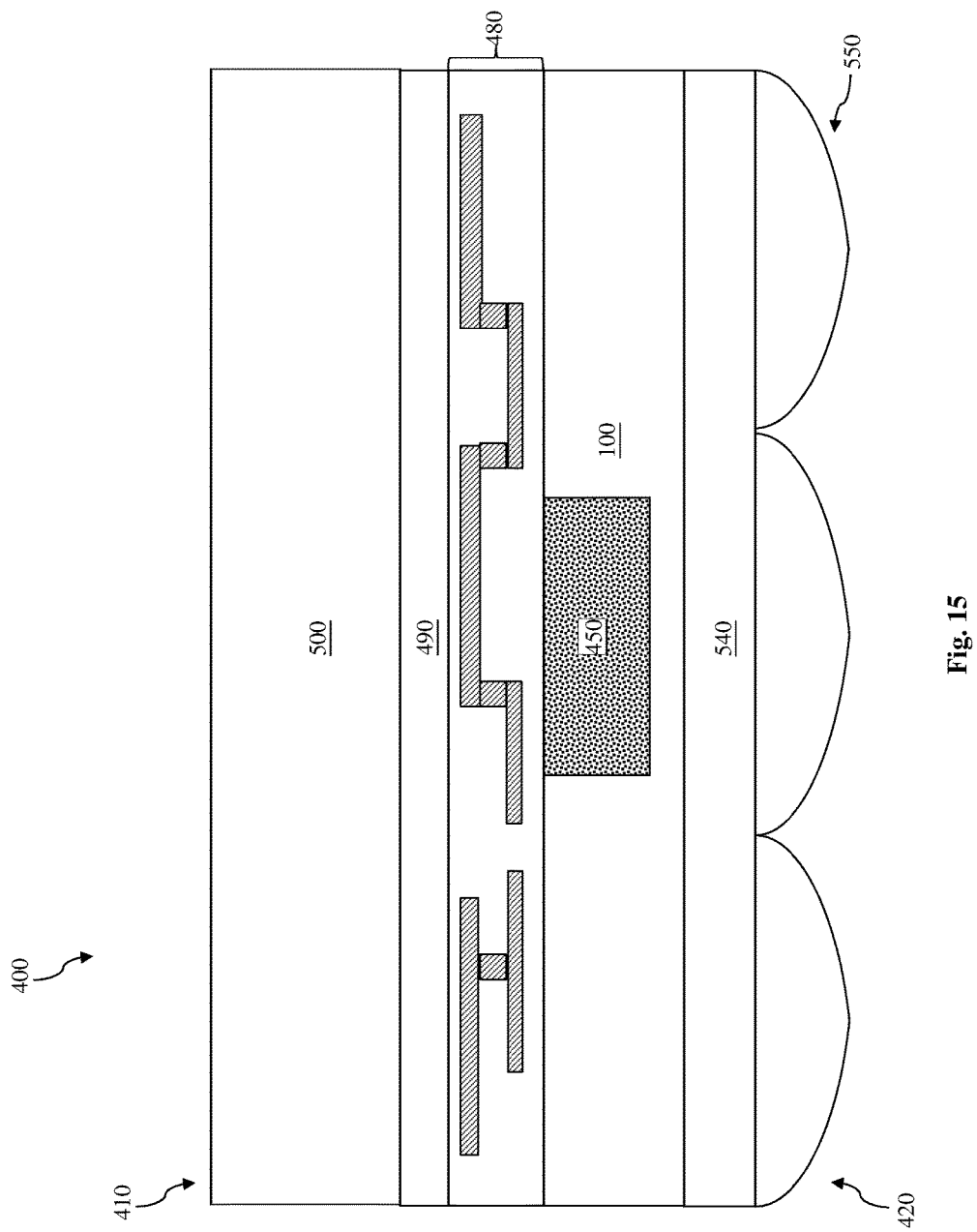

Referring now to FIG. 15, a color filter layer 540 may be formed on the back side 420 of the substrate 100. The color filter layer 540 may contain a plurality of color filters that are positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer 550 containing a plurality of micro-lenses is formed over the color filter layer 540. The micro-lenses direct and focus the incoming radiation toward specific radiation-sensing regions in the device substrate 100, such as the radiation-sensing element 450. The micro-lenses may be positioned in various arrangements and have various shapes depending on a refractive index of a material used for the micro-lens and distance from a sensor surface. The device substrate 100 may also undergo an optional laser annealing process before the forming of the color filter layer 540 or the micro-lens layer 550.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity. For example, an anti-reflection coating (ARC) layer may be formed over the back side 420 of the substrate 100 before the formation of the color filter layer 540 and/or the micro-lens layer 550.

It is also understood that the discussions above pertain mostly to a pixel array region of the image sensor device 400. In addition to the pixel region, the image sensor device 400 also includes a periphery region, a bonding pad region, and a scribe line region. The periphery region may include devices that need to be kept optically dark. These devices may include digital devices, such as application-specific integrated circuit (ASIC) devices or system-on-chip (SOC) devices, or reference pixels used to establish a baseline of an intensity of light for the image sensor device 400. The bonding pad region is reserved for the formation of bonding pads, so that electrical connections between the image sensor device 400 and external devices may be established. The scribe line region includes a region that separates one semiconductor die from an adjacent semiconductor die. The scribe line region is cut therethrough in a later fabrication process to separate adjacent dies before the dies are packaged and sold as integrated circuit chips. For the sake of simplicity, the details of these other regions of the image sensor device 400 are not illustrated or described herein.

The above discussions also pertain to a BSI image sensor device. However, it is contemplated that the various aspects of the present disclosure may be applied to a front side illuminated (FSI) image sensor device as well. For example, the FSI image sensor device also uses pixels similar to the pixels 210 discussed herein to detect light, though the light is projected (and enters the substrate) from the front side, rather than the back side. The FSI image sensor device does not involve wafer back side thinning processes, and will instead form the color filters and micro-lenses on the front side. The interconnect structure is implemented in a manner so as to not impede or obstruct the path of incident light projected from the front side. It can be seen that the photoresist patterns formed in accordance with the present disclosure (with a high aspect ratio trench) can be used to form the radiation-sensing elements for the FSI image sensor device as well.

Figure 16:
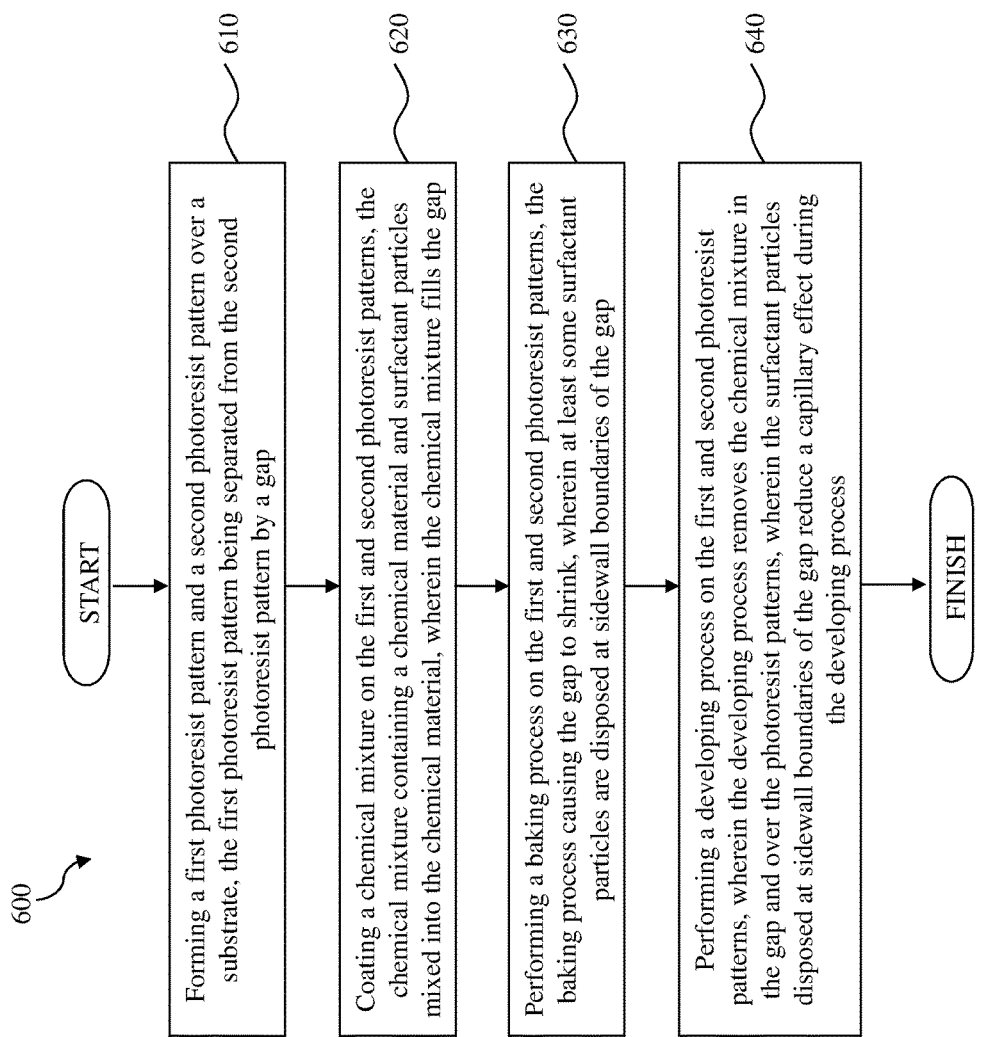
FIGS. 16-18 are flowcharts illustrating methods of fabricating a semiconductor device in accordance with embodiments of the present disclosure.

FIG. 16 is a flowchart illustrating a method 600 of fabricating a semiconductor device according to embodiments of the present disclosure. The method 600 includes a step 610 of forming a first photoresist pattern and a second photoresist pattern over a substrate. The first photoresist pattern is separated from the second photoresist pattern by a gap.

The method 600 includes a step 620 of coating a chemical mixture on the first and second photoresist patterns. The chemical mixture contains a chemical material and surfactant particles mixed into the chemical material. The chemical mixture fills the gap.

The method 600 includes a step 630 of performing a baking process on the first and second photoresist patterns. The baking process causes the gap to shrink. At least some surfactant particles are disposed at sidewall boundaries of the gap.

The method 600 includes a step 640 of performing a developing process on the first and second photoresist patterns. The developing process removes the chemical mixture in the gap and over the photoresist patterns. The surfactant particles disposed at sidewall boundaries of the gap reduce a capillary effect during the developing process.

In some embodiments, the chemical material has thermal cross-linking properties such that the baking process of step 630 causes a portion of the chemical mixture to become cross-linked with sidewalls of the first and second photoresist patterns. The cross-linked portions of the chemical mixture define the sidewall boundaries of the gap.

In some embodiments, the chemical material contains thermo-responsive copolymers that facilitate a flow of the first and second photoresist patterns during the baking process of step 630. The flow of the first and second photoresist patterns causes the gap to shrink.

It is understood that additional steps may be performed before, during, and after the steps 610-640 of method 600. For example, the method 600 may include a step of, before the coating: mixing the surfactant particles in the chemical material in a homogeneously distributed manner. In some embodiments, the method 600 includes a step of, before the mixing: obtaining a fluorinated surfactant as the surfactant particles. In some embodiments, the method 600 includes a step of, before the mixing: obtaining a hydrocarbon surfactant as the surfactant particles. In some embodiments, the method 600 includes a step of, after the developing process is performed: forming a contact hole, wherein the forming of the contact hole is performed using the first and second photoresist patterns as a mask. In some embodiments, the method 600 includes a step of, after the developing process is performed: forming a photo-sensitive pixel of an image sensor device, wherein the forming of the photo-sensitive pixel is performed using the first and second photoresist patterns as a mask.

Figure 17:
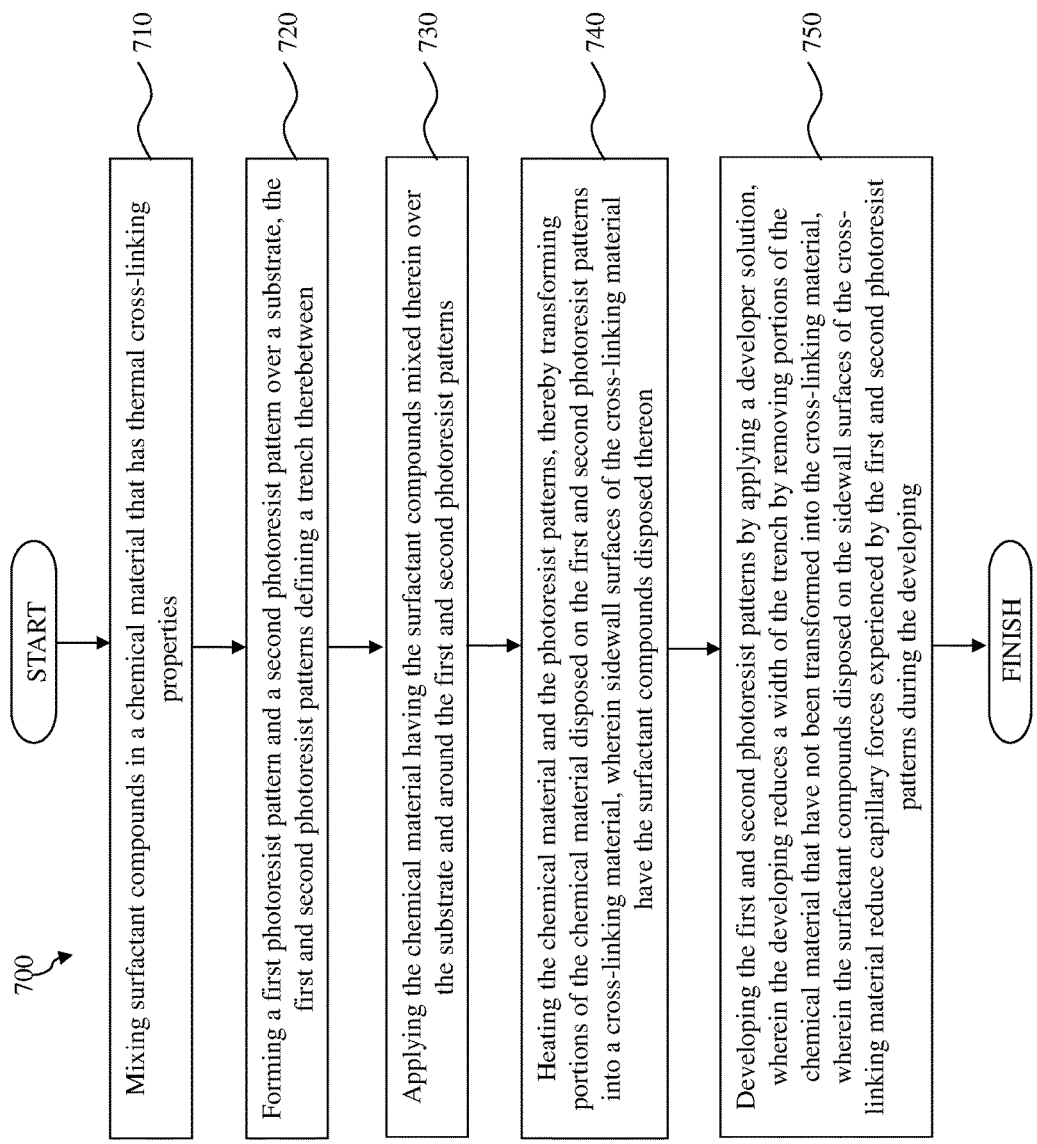

FIG. 17 is a flowchart illustrating a method 700 of fabricating a semiconductor device according to embodiments of the present disclosure. The method 700 includes a step 710 of mixing surfactant compounds in a chemical material that has thermal cross-linking properties.

The method 700 includes a step 720 of forming a first photoresist pattern and a second photoresist pattern over a substrate, the first and second photoresist patterns defining a trench therebetween.

The method 700 includes a step 730 of applying the chemical material having the surfactant compounds mixed therein over the substrate and around the first and second photoresist patterns.

The method 700 includes a step 740 of heating the chemical material and the photoresist patterns, thereby transforming portions of the chemical material disposed on the first and second photoresist patterns into a cross-linking material. The sidewall surfaces of the cross-linking material have the surfactant compounds disposed thereon.

The method 700 includes a step 750 of developing the first and second photoresist patterns by applying a developer solution. The developing reduces a width of the trench by removing portions of the chemical material that have not been transformed into the cross-linking material. The surfactant compounds disposed on the sidewall surfaces of the cross-linking material reduce capillary forces experienced by the first and second photoresist patterns during the developing.

In some embodiments, the mixing comprises: mixing the surfactant compounds uniformly in the chemical material.

It is understood that additional steps may be performed before, during, and after the steps 710-750 of method 700. For example, in some embodiments, the method 700 may include a step of, before the mixing: obtaining fluorinated surfactants as the surfactant compounds. In some embodiments, the method 700 may include a step of, before the mixing: obtaining hydrocarbon surfactants as the surfactant compounds. In some embodiments, the method 700 may include a step of, after the developing: forming a contact hole through an etching process in which first and second photoresist patterns serve as an etching mask. In some embodiments, the method 700 may include a step of, after the developing: forming a radiation-sensing region of an image sensor device through an ion implantation process in which the first and second photoresist patterns serve as an implantation mask.

Figure 18:
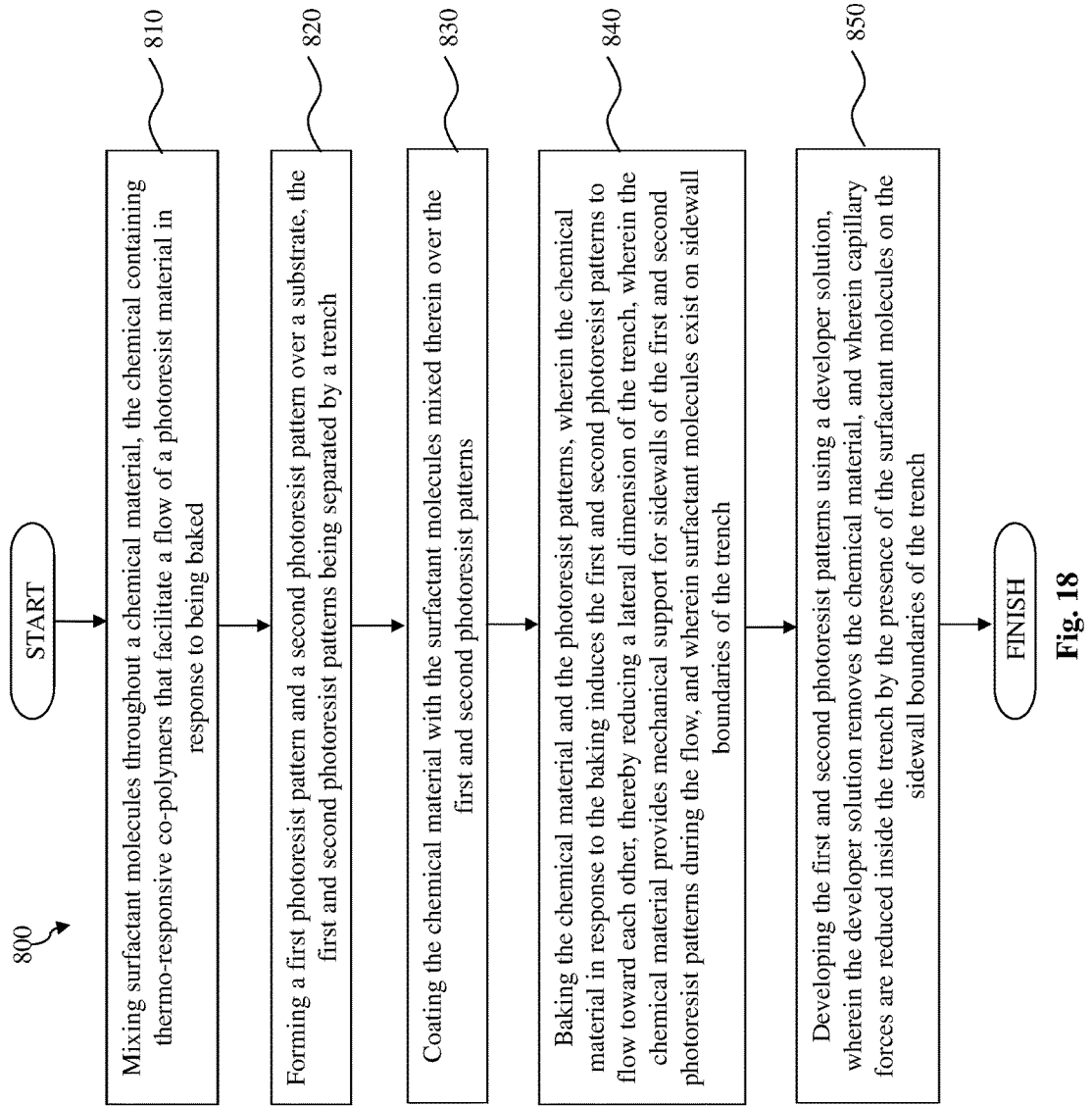

FIG. 18 is a flowchart illustrating a method 800 of fabricating a semiconductor device according to embodiments of the present disclosure. The method 800 includes a step 810 of mixing surfactant molecules throughout a chemical material. The chemical contains thermo-responsive copolymers that facilitate a flow of a photoresist material in response to being baked.

The method 800 includes a step 820 of forming a first photoresist pattern and a second photoresist pattern over a substrate. The first and second photoresist patterns are separated by a trench.

The method 800 includes a step 830 of coating the chemical material with the surfactant molecules mixed therein over the first and second photoresist patterns.

The method 800 includes a step 840 of baking the chemical material and the photoresist patterns. The chemical material in response to the baking induces the first and second photoresist patterns to flow toward each other, thereby reducing a lateral dimension of the trench. The chemical material provides mechanical support for sidewalls of the first and second photoresist patterns during the flow. The surfactant molecules exist on sidewall boundaries of the trench.

The method 800 includes a step 850 of developing the first and second photoresist patterns using a developer solution. The developer solution removes the chemical material. Capillary forces are reduced inside the trench by the presence of the surfactant molecules on the sidewall boundaries of the trench.

In some embodiments, the mixing in step 810 includes mixing fluorinated surfactant molecules within the chemical material. In some embodiments, the mixing in step 820 includes mixing hydrocarbon surfactant molecules within the chemical material. In some embodiments, the mixing comprises: mixing the surfactant molecules evenly in the chemical material.

It is understood that additional steps may be performed before, during, and after the steps 810-850 of method 800. For example, in some embodiments, the method 800 includes a step of forming a contact hole at least in part by an etching process, the first and second photoresist patterns serving as a mask for the etching process. In some other embodiments, the method 800 includes a step of after the developing: forming a radiation-sensing region of an image sensor device by an ion implantation process, the first and second photoresist patterns serving as an implantation mask for the ion implantation process.

Based on the above discussions, it can be seen that the present disclosure offers advantages over conventional semiconductor fabrication. It is understood, however, that other embodiments may offer additional advantages, and not all advantages are necessarily disclosed herein, and that no particular advantage is required for all embodiments. One advantage is that the photoresist patterns can be formed with a high aspect ratio trench in between without risking the collapse of the photoresist patterns. For example, as discussed above, a chemical shrinkage material (either RELACS or SAFIER) allows the photoresist patterns to effectively "shrink" laterally, which reduces the lateral dimension or width of the trench. In this process, a developer solution used to remove the shrinkage material gives rise to capillary forces inside the trench, which may pull on the photoresist patterns. Conventionally, the capillary forces may cause the photoresist patterns to collapse if the photoresist patterns are too tall and/or if they are located too close to one another. To avoid this problem, conventionally photoresist pattern formation methods limit the aspect ratio of the trench by reducing the height of the photoresist pattern, or increasing the space in between them, neither of which is desirable in advanced semiconductor fabrication with ever-decreasing device sizes.

In comparison, the present disclosure overcomes this problem by mixing surfactant particles in the chemical shrinkage material, such that some surfactant particles are disposed on the sidewall surfaces of the trench during the developing process. The surfactant particles reduce the surface tension, which is correlated with the capillary forces. As such, the effects of the capillary forces experienced by the photoresist patterns are also reduced by the presence of these surfactant particles, which diminishes the risks of photoresist pattern collapse. As a result, the present disclosure can form photoresist patterns with a greater height and/or closer spacing than conventionally possible, while not risking the photoresist pattern collapse issue. Such photoresist patterns can be used as a mask in subsequent processes such as contact hole formation or pixel ion implantation to achieve better results, such as smaller device sizes or greater device pattern density. Other advantages may include lower costs, increased yield, and compatibility with existing fabrication process flow.

One aspect of the present disclosure involves a method of fabricating a semiconductor device. A first photoresist pattern and a second photoresist pattern are formed over a substrate. The first photoresist pattern is separated from the second photoresist pattern by a gap. A chemical mixture is coated on the first and second photoresist patterns. The chemical mixture contains a chemical material and surfactant particles mixed into the chemical material. The chemical mixture fills the gap. A baking process is performed on the first and second photoresist patterns, the baking process causing the gap to shrink. At least some surfactant particles are disposed at sidewall boundaries of the gap. A developing process is performed on the first and second photoresist patterns. The developing process removes the chemical mixture in the gap and over the photoresist patterns. The surfactant particles disposed at sidewall boundaries of the gap reduce a capillary effect during the developing process.

One aspect of the present disclosure involves a method of fabricating a semiconductor device. Surfactant compounds are mixed in a chemical material that has thermal cross-linking properties. A first photoresist pattern and a second photoresist pattern are formed over a substrate. The first and second photoresist patterns define a trench therebetween. The chemical material having the surfactant compounds mixed therein is applied over the substrate and around the first and second photoresist patterns. The chemical material and the photoresist patterns are heated, thereby transforming portions of the chemical material disposed on the first and second photoresist patterns into a cross-linking material. Sidewall surfaces of the cross-linking material have the surfactant compounds disposed thereon. The first and second photoresist patterns are developed by applying a developer solution. The developing reduces a width of the trench by removing portions of the chemical material that have not been transformed into the cross-linking material. The surfactant compounds disposed on the sidewall surfaces of the cross-linking material reduce capillary forces experienced by the first and second photoresist patterns during the developing.

One aspect of the present disclosure involves a method of fabricating a semiconductor device. Surfactant molecules are mixed throughout a chemical material. The chemical contains thermo-responsive co-polymers that facilitate a flow of a photoresist material in response to being baked. A first photoresist pattern and a second photoresist pattern are formed over a substrate. The first and second photoresist patterns are separated by a trench. The chemical material with the surfactant molecules mixed therein is coated over the first and second photoresist patterns. After the coating, the chemical material and the photoresist patterns are baked. The chemical material in response to the baking induces the first and second photoresist patterns to flow toward each other, thereby reducing a lateral dimension of the trench. The chemical material provides mechanical support for sidewalls of the first and second photoresist patterns during the flow. The surfactant molecules exist on sidewall boundaries of the trench. After the baking, the first and second photoresist patterns are developed using a developer solution. The developer solution removes the chemical material. Capillary forces are reduced inside the trench by the presence of the surfactant molecules on the sidewall boundaries of the trench.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
   forming a first photoresist pattern and a second photoresist pattern over a substrate, the first photoresist pattern being separated from the second photoresist pattern by a trench having an aspect ratio at least as high as about 8:1;
   coating a chemical mixture on the first and second photoresist patterns, the chemical mixture containing a chemical material and surfactant particles mixed into the chemical material, wherein the chemical mixture fills the trench;
   thereafter performing a baking process on the first and second photoresist patterns, the baking process causing the trench to shrink, wherein at least some surfactant particles are disposed at sidewall boundaries of the trench; and
   thereafter performing a developing process on the first and second photoresist patterns, wherein the developing process removes the chemical mixture in the trench and over the first and second photoresist patterns, wherein the surfactant particles disposed at sidewall boundaries of the trench reduce a capillary effect during the developing process.

2. The method of claim 1, wherein the chemical material has thermal cross-linking properties such that the baking process causes portions of the chemical mixture to become cross-linked with sidewalls of the first and second photoresist patterns, and wherein the cross-linked portions of the chemical mixture define the sidewall boundaries of the trench.

3. The method of claim 1, wherein the chemical material contains thermo-responsive copolymers that facilitate a flow of the first and second photoresist patterns during the baking process, wherein the flow of the first and second photoresist patterns causes the trench to shrink.

4. The method of claim 1, further comprising, before the coating: mixing the surfactant particles in the chemical material in a homogeneously distributed manner.

5. The method of claim 4, further comprising, before the mixing: obtaining a fluorinated surfactant as the surfactant particles.

6. The method of claim 4, further comprising, before the mixing: obtaining a hydrocarbon surfactant as the surfactant particles.

7. The method of claim 1, further comprising, after the developing process is performed: forming a contact hole, wherein the forming of the contact hole is performed using the first and second photoresist patterns as a mask.

8. The method of claim 1, further comprising, after the developing process is performed: forming a photo-sensitive pixel of an image sensor device, wherein the forming of the photo-sensitive pixel is performed using the first and second photoresist patterns as a mask.

9. A method of fabricating a semiconductor device, comprising:
   mixing surfactant compounds in a chemical material that has thermal cross-linking properties;
   forming a first photoresist pattern and a second photoresist pattern over a substrate, the first and second photoresist patterns defining a trench therebetween, the trench having an aspect ratio greater than about 8:1;
   applying the chemical material having the surfactant compounds mixed therein over the substrate and around the first and second photoresist patterns;
   heating the chemical material and the photoresist patterns, thereby transforming portions of the chemical material disposed on the first and second photoresist patterns into a cross-linking material, wherein sidewall surfaces of the cross-linking material have the surfactant compounds disposed thereon; and
   developing the first and second photoresist patterns by applying a developer solution, wherein the developing reduces a width of the trench by removing portions of the chemical material that have not been transformed into the cross-linking material, wherein the surfactant compounds disposed on the sidewall surfaces of the cross-linking material reduce capillary forces experienced by the first and second photoresist patterns during the developing.

10. The method of claim 9, further comprising, before the mixing: obtaining fluorinated surfactants as the surfactant compounds.

11. The method of claim 9, further comprising, before the mixing: obtaining hydrocarbon surfactants as the surfactant compounds.

12. The method of claim 9, wherein the mixing comprises: mixing the surfactant compounds uniformly in the chemical material.

13. The method of claim 9, further comprising, after the developing: forming a contact hole through an etching process in which first and second photoresist patterns serve as an etching mask.

14. The method of claim 9, further comprising, after the developing: forming a radiation-sensing region of an image sensor device through an ion implantation process in which the first and second photoresist patterns serve as an implantation mask.

15. A method of fabricating a semiconductor device, comprising:
   mixing surfactant molecules throughout a chemical material, the chemical material containing thermo-responsive co-polymers that facilitate a flow of a photoresist material in response to being baked;
   forming a first photoresist pattern and a second photoresist pattern over a substrate, the first and second photoresist patterns being separated by a trench, wherein a ratio between a height of the trench and a width of the trench is greater than about 8:1;
   coating the chemical material with the surfactant molecules mixed therein over the first and second photoresist patterns;

after the coating, baking the chemical material and the photoresist patterns, wherein the chemical material in response to the baking induces the first and second photoresist patterns to flow toward each other, thereby reducing a lateral dimension of the trench, wherein the chemical material provides mechanical support for sidewalls of the first and second photoresist patterns during the flow, and wherein surfactant molecules exist on sidewall boundaries of the trench; and after the baking, developing the first and second photoresist patterns using a developer solution, wherein the developer solution removes the chemical material, and wherein capillary forces are reduced inside the trench by a presence of the surfactant molecules on the sidewall boundaries of the trench.

16. The method of claim 15, wherein the mixing comprises: mixing fluorinated surfactant molecules within the chemical material.

17. The method of claim 15, wherein the mixing comprises: mixing hydrocarbon surfactant molecules within the chemical material.

18. The method of claim 15, wherein the mixing comprises: mixing the surfactant molecules evenly in the chemical material.

19. The method of claim 15, further comprising, after the developing: forming a contact hole at least in part by an etching process, the first and second photoresist patterns serving as a mask for the etching process.

20. The method of claim 15, further comprising, after the developing: forming a radiation-sensing region of an image sensor device by an ion implantation process, the first and second photoresist patterns serving as an implantation mask for the ion implantation process.

* * * * *